(12) United States Patent
Park et al.

(10) Patent No.: US 10,192,973 B2
(45) Date of Patent: Jan. 29, 2019

(54) METHODS OF FORMING SEMICONDUCTOR DEVICES INCLUDING TRENCH WALLS HAVING MULTIPLE SLOPES

(71) Applicant: Samsung Electronics Co., Ltd., Suwon-si, Gyeonggi-do (KR)

(72) Inventors: Sang-Jine Park, Yongin-si (KR); Bo-Un Yoon, Seoul (KR); Ha-Young Jeon, Hwasung-si (KR); Byung-Kwon Cho, Suwon-si (KR); Jeong-Nam Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/239,200

(22) Filed: Aug. 17, 2016

(65) Prior Publication Data

US 2016/0359017 A1 Dec. 8, 2016

Related U.S. Application Data

(63) Continuation of application No. 14/455,036, filed on Aug. 8, 2014, now Pat. No. 9,443,979.

(30) Foreign Application Priority Data

Dec. 27, 2013 (KR) .................. 10-2013-0165535

(51) Int. Cl.
*H01L 29/66* (2006.01)
*H01L 29/78* (2006.01)
(Continued)

(52) U.S. Cl.
CPC .. *H01L 29/66545* (2013.01); *H01L 21/28114* (2013.01); *H01L 27/0886* (2013.01);
(Continued)

(58) Field of Classification Search
CPC ......... H01L 29/66545; H01L 29/66606; H01L 29/66795; H01L 29/785; H01L 21/76829; H01L 21/81142
See application file for complete search history.

(56) References Cited

U.S. PATENT DOCUMENTS 7,381,608 B2 6/2008 Brask et al.
7,642,589 B2 1/2010 Son et al.
(Continued)

FOREIGN PATENT DOCUMENTS

CN 101099241 1/2008
CN 102569367 7/2012
(Continued)

OTHER PUBLICATIONS

Chinese Office Action corresponding to Chinese Patent Application No. 201410768392.6 (8 pages) (dated Sep. 4, 2018).

*Primary Examiner* — Thanhha Pham
(74) *Attorney, Agent, or Firm* — Myers Bigel, P.A.

(57) ABSTRACT

A semiconductor device includes a gate spacer defining a trench. The trench includes a first part and a second part sequentially positioned on a substrate. An inner surface of the first part has a slope of an acute angle and an inner surface of the second part has a slope of a right angle or obtuse angle with respect to the substrate. A gate electrode fills at least a portion of the trench.

17 Claims, 27 Drawing Sheets

(51) Int. Cl.
  *H01L 21/28* (2006.01)
  *H01L 29/49* (2006.01)
  *H01L 27/088* (2006.01)
  *H01L 29/423* (2006.01)

(52) U.S. Cl.
  CPC .... *H01L 29/42376* (2013.01); *H01L 29/4958* (2013.01); *H01L 29/66795* (2013.01); *H01L 29/785* (2013.01); *H01L 29/7851* (2013.01); *H01L 29/4966* (2013.01); *H01L 29/7848* (2013.01)

(56) References Cited

U.S. PATENT DOCUMENTS

| | | | |
|---|---|---|---|
| 8,298,875 | B1 | 10/2012 | Or-Bach et al. |
| 8,575,689 | B2 | 11/2013 | Mimura et al. |
| 2008/0248649 | A1 | 10/2008 | Adetutu et al. |
| 2009/0008705 | A1 | 1/2009 | Zhu et al. |
| 2011/0127589 | A1 | 6/2011 | Chen |
| 2012/0129331 | A1 | 5/2012 | Choi et al. |
| 2012/0248550 | A1 | 10/2012 | Huang et al. |
| 2013/0115773 | A1 | 5/2013 | Pal et al. |
| 2013/0154012 | A1 | 6/2013 | Fu et al. |
| 2013/0187236 | A1* | 7/2013 | Xie ................... H01L 29/4966 257/369 |
| 2014/0124873 | A1* | 5/2014 | Jagannathan ........... H01L 29/49 257/407 |
| 2015/0325483 | A1* | 11/2015 | Tran ....................... H01L 28/20 438/382 |

FOREIGN PATENT DOCUMENTS

| | | |
|---|---|---|
| JP | 2006-140190 A | 6/2006 |
| KR | 10-2010-074633 A | 7/2010 |

* cited by examiner

1200

1300

METHODS OF FORMING SEMICONDUCTOR DEVICES INCLUDING TRENCH WALLS HAVING MULTIPLE SLOPES

CROSS-REFERENCE TO RELATED APPLICATIONS

This application is a continuation of U.S. patent application Ser. No. 14/455,036, filed Aug. 8, 2014, which itself claims priority from Korean Patent Application No. 10-2013-0165535 filed on Dec. 27, 2013 in the Korean Intellectual Property Office, and all the benefits accruing therefrom under 35 U.S.C. 119, the contents of both of which in their entireties are herein incorporated by reference.

BACKGROUND

1. Field of the Invention

The present invention relates to semiconductor devices and methods for fabricating the same.

2. Description of the Related Art

Recently, along with the rapid proliferation of information media, functionality of a semiconductor is remarkably advancing. Recently developed semiconductor products can be fabricated at low cost for attaining price competitiveness and can be highly integrated for achieving high quality. Specifically, in order to achieve high integration of semiconductor devices, the semiconductor devices have been gradually scaled down.

Integrated semiconductor devices may include active devices, such as metal oxide semiconductor (MOS) transistors. According to integration of semiconductor devices, a gate of a MOS transistor is being reduced in size, and a channel region under the gate is becoming narrow.

As the width of a gate of a transistor is reduced, a distance between contacts formed at the gate of the transistor and a source and drain region of the transistor may also decrease.

SUMMARY

The present inventive concepts can provide a semiconductor device, which can have improved operating performance by reducing a change in the height of a replacement metal gate electrode.

The present inventive concepts also can provide a method for fabricating a semiconductor device, which can suppress an interlayer insulation film from being lost in the course of forming a replacement metal gate electrode.

These and other objects of the present inventive concepts will be described in or be apparent from the following description of various embodiments of the inventive concepts.

According to some aspects of the present inventive concepts, there is provided a semiconductor device including a gate spacer defining a trench and including a first part and a second part sequentially positioned on a substrate, an inner surface of the first part having a slope of an acute angle and an inner surface of the second part having a slope of a right angle or obtuse angle with respect to the substrate, and a gate electrode in, and in some embodiments filling, at least a portion of the trench.

In some embodiments, the inner surface of the first part of the gate spacer and the inner surface of the second part of the gate spacer have a continuous profile.

In some embodiments, the gate spacer further includes a third part positioned on the second part of the gate spacer remote from the first part, and the third part of the gate spacer is connected to the second part of the gate spacer.

In some embodiments, the inner surface of the second part of the gate spacer and an inner surface of the third part of the gate spacer have a discontinuous profile.

In some embodiments, at a boundary between the second part of the gate spacer and the third part of the gate spacer, a width of the trench defined by the third part of the gate spacer is greater than a width of the trench defined by the second part of the gate spacer.

In some embodiments, the first part of the gate spacer has a greater height than the second part of the gate spacer.

In some embodiments, an inner surface of the gate spacer has a first point, a second point and a third point sequentially disposed away from the substrate, a width of the trench at the first point is greater than a width of the trench at the second point, and a width of the trench at the third point is greater than at a width of the trench at the second point.

In some embodiments, a height from the substrate to a top surface of the gate spacer is greater than a height from the substrate to a top surface of the gate electrode.

In some embodiments, the gate electrode fills a portion of the trench, and the semiconductor device further includes a capping pattern formed on the gate electrode to fill the remaining portion of the trench.

The semiconductor device may further comprise a self-aligned contact adjacent to the gate spacer.

The semiconductor device may further comprise a gate insulation film extending along side surfaces and a bottom surface of the trench between the substrate and the gate electrode, and the gate electrode includes a lower gate electrode extending along the gate insulation film on the gate insulation film and an upper gate electrode on the lower gate electrode.

In some embodiments, the gate electrode is a replacement metal gate electrode.

According to another aspect of the present inventive concepts, there is provided a semiconductor device including a gate spacer defining a trench and including a first part, a second part and a third part sequentially positioned on a substrate, an inner surface of the first part of the gate spacer having a slope of an acute angle and an inner surface of the second part having a slope of a right angle or obtuse angle with respect to the substrate, a lower gate electrode extending along portions of side surfaces and a bottom surface of the trench, an upper gate electrode extending on the lower gate electrode in, and in some embodiments to fill, a portion of the trench and having a top surface coplanar with an uppermost surface of the lower gate electrode, and a capping pattern on the lower gate electrode and the upper gate electrode extending in, and in some embodiments to fill, a portion of the trench.

In some embodiments, the inner surface of the first part of the gate spacer and an inner surface of the second part of the gate spacer have a continuous profile, and the inner surface of the second part of the gate spacer and an inner surface of the third part of the gate spacer have a discontinuous profile.

The semiconductor device may further comprise a self-aligned contact adjacent to the gate spacer.

According to still other aspects of the present inventive concepts, there is provided a semiconductor device including a fin type active pattern protruding onto a field insulation film, a gate spacer defining a trench on the fin type active pattern and crossing the fin type active pattern and including a first part and a second part, an inner surface of the first part of the gate spacer having a slope of an acute angle and an inner surface of the second part having a slope of a right angle or obtuse angle with respect to the fin type active pattern, and a replacement metal gate electrode in, and in some embodiments filling, at least a portion of the trench.

In some embodiments, the first part of the gate spacer and the second part of the gate spacer are sequentially positioned on the field insulation film, and the inner surface of the first part of the gate spacer and the inner surface of the second part of the gate spacer have a continuous profile.

In some embodiments, a height of the first part of the gate spacer is greater than a height from the field insulation film to a top surface of the fin type active pattern.

In some embodiments, the gate spacer further includes a third part on the second part of the gate spacer remote from the first part and connected to the second part of the gate spacer, and the inner surface of the second part of the gate spacer and an inner surface of the third part of the gate spacer have a discontinuous profile.

In some embodiments, the replacement metal gate electrode fills a portion of the trench and further includes a capping pattern on the replacement metal gate electrode to fill the trench and having a top surface coplanar with the top surface of the gate spacer.

According to further aspects of the present inventive concepts, there is provided a semiconductor device including a first gate spacer defining a first trench and including a first part and a second part sequentially positioned on a substrate, an inner surface of the first part of the first gate spacer having a slope of an acute angle and an inner surface of the second part of the first gate spacer having a slope of a right angle or obtuse angle with respect to the substrate, a second gate spacer defining a second trench and including a third part and a fourth part sequentially positioned on the substrate, an inner surface of the third part of the second gate spacer having a slope of an acute angle and an inner surface of the fourth part of the second gate spacer having a slope of a right angle or obtuse angle with respect to the substrate, a first gate electrode in, and in some embodiments filling, at least a portion of the first trench and including a first n type work function control film, and a second gate electrode in, and in some embodiments filling, at least a portion of the second trench and including a second n type work function control film and a p type work function control film.

In some embodiments, the first gate electrode and the second gate electrode fill portions of the first trench and the second trench, respectively, and the semiconductor device further includes a first capping pattern on the first gate electrode to fill a remaining portion of the first trench, and a second capping pattern on the second gate electrode to fill a remaining portion of the second trench.

In some embodiments, the inner surface of the first part of the first gate spacer and the inner surface of the second part of the first gate spacer have a continuous profile, and the inner surface of the third part of the second gate spacer and the inner surface of the fourth part of the second gate spacer have a discontinuous profile.

In some embodiments, the first n type work function control film extends along at least portions of side surfaces and a bottom surface of the first trench, the first gate electrode includes a first filling gate electrode on the first n type work function control film to fill at least a portion of the first trench, the p type work function control film extends along at least portions of side surfaces and a bottom surface of the second trench, the second n type work function control film extends along the p type work function control film on the p type work function control film, and the second gate electrode includes a second filling gate electrode on the second n type work function control film to fill at least a portion of the second trench.

In some embodiments, the second n type work function control film extends on, and in some embodiments covers, an uppermost surface of the p type work function control film.

According to yet other aspects of the present inventive concepts, a semiconductor device comprises a layer on a substrate, the layer including a trench therein that comprises a trench opening remote from the substrate, a trench floor adjacent the substrate and a trench wall between the trench opening and the trench floor. The trench wall is pinched relative to the trench opening and the trench floor. The semiconductor device also comprises a conductive layer in the trench that includes a conductive layer top adjacent the trench opening, a conductive layer bottom adjacent the trench floor and a conductive layer wall between the conductive layer top and the conductive layer bottom. The conductive layer wall is also pinched relative to the conductive layer top and the conductive layer bottom.

In some embodiments, the layer is a unitary insulating layer. Moreover, in some embodiments, the layer comprises a gate spacer and includes first and second opposing outer walls, and the conductive layer comprise a gate electrode. In these embodiments, the semiconductor device further comprises a first source/drain region on first outer wall remote from the trench and a second source/drain region on the second outer wall remote from the trench. In some embodiments, the semiconductor device further comprises an active semiconductor region that extends from beneath the first source/drain region to beneath the floor of the trench and to beneath the second source/drain region.

In some embodiments, the conductive layer top is recessed from the trench opening. The semiconductor device may further comprise a second conductive layer in the trench on the conductive layer top and extending to the trench opening.

BRIEF DESCRIPTION OF THE DRAWINGS

The above and other features and advantages of the present inventive concepts will become more apparent by describing in detail various embodiments thereof with reference to the attached drawings in which.

DETAILED DESCRIPTION OF THE EMBODIMENTS

Figure 1A:
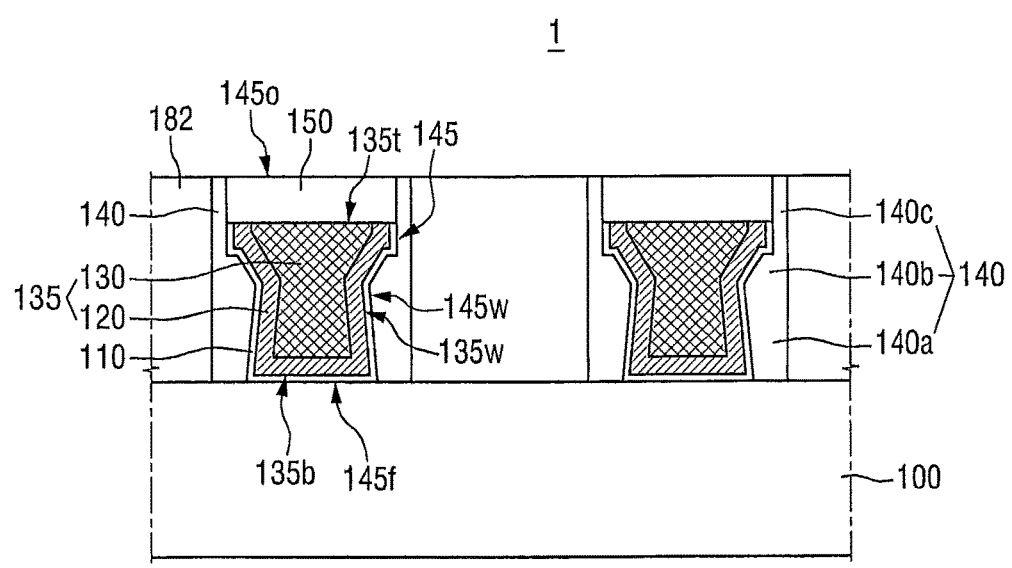
FIGS. 1A and 1B illustrate a semiconductor device according to a first embodiment of the present inventive concepts.

The present inventive concepts will now be described more fully hereinafter with reference to the accompanying drawings, in which various embodiments of the inventive concepts are shown. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or exemplary terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Hereinafter, a semiconductor device according to a first embodiment of the present inventive concepts will be described with reference to FIGS. 1A to 3B.

Figure 1B:
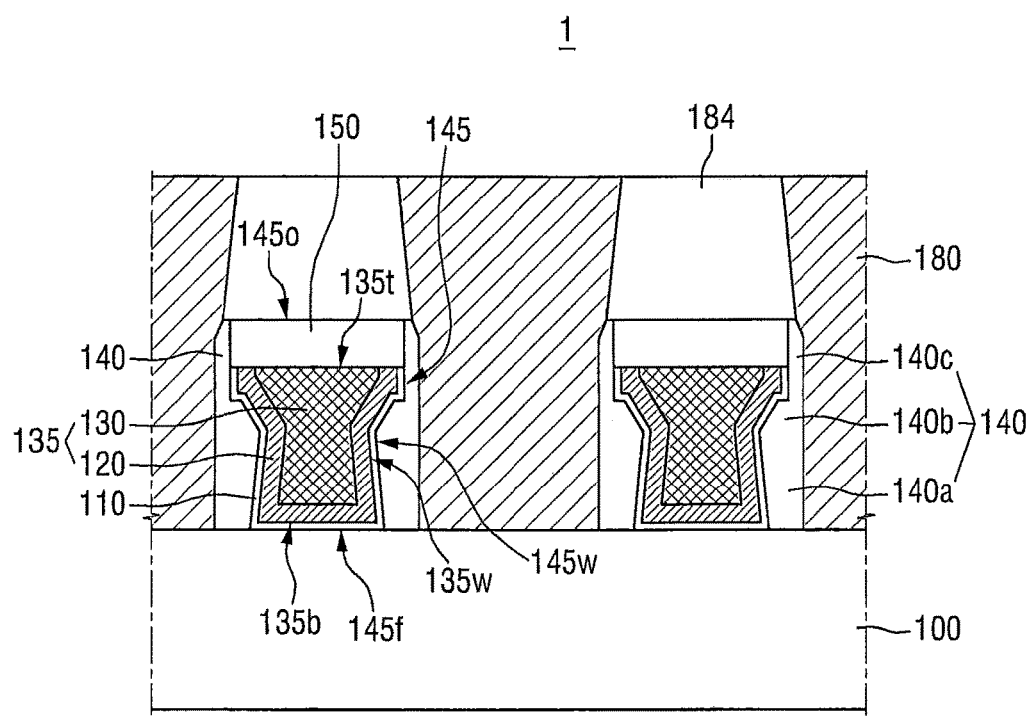
Figure 2:
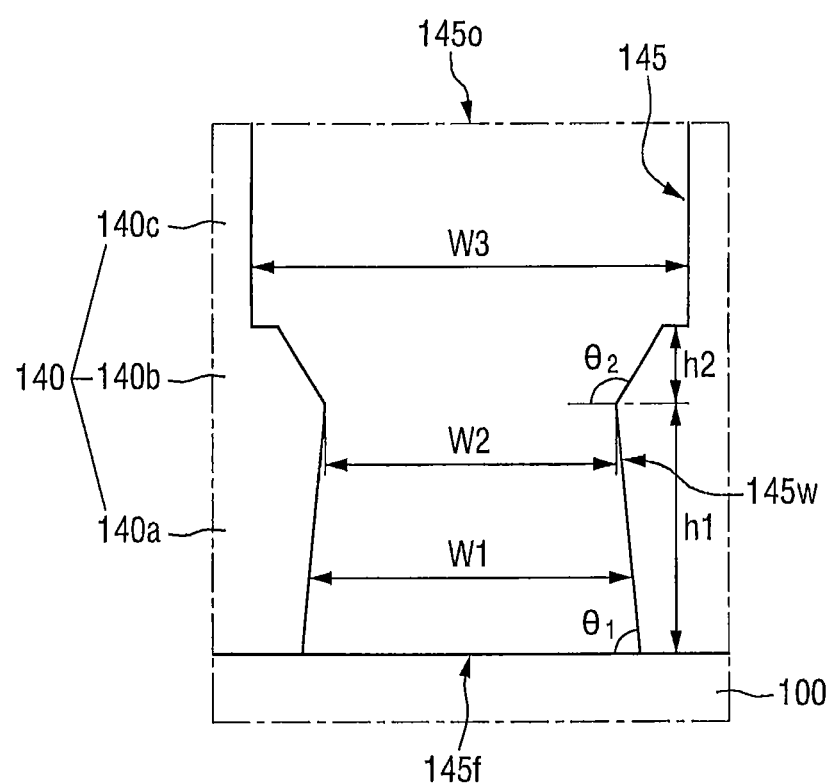
FIG. 2 illustrates a gate spacer of FIG. 1.
Figure 3A:
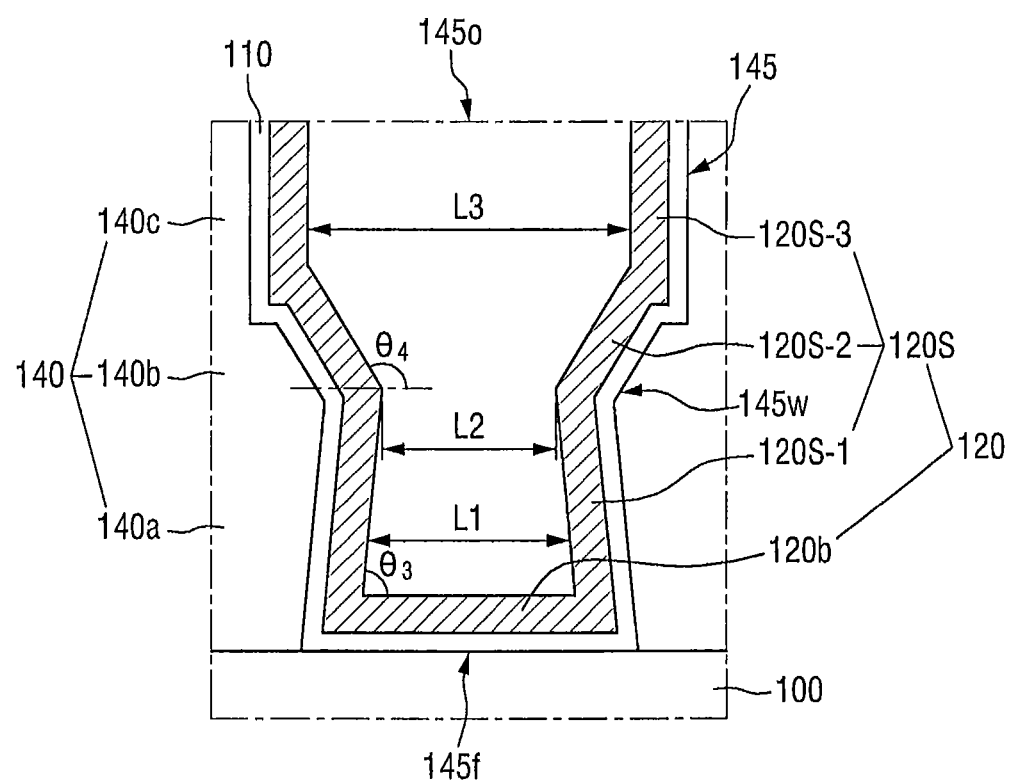
FIGS. 3A and 3B illustrate shapes of gate electrodes formed on the gate spacer of FIG. 2.
Figure 3B:
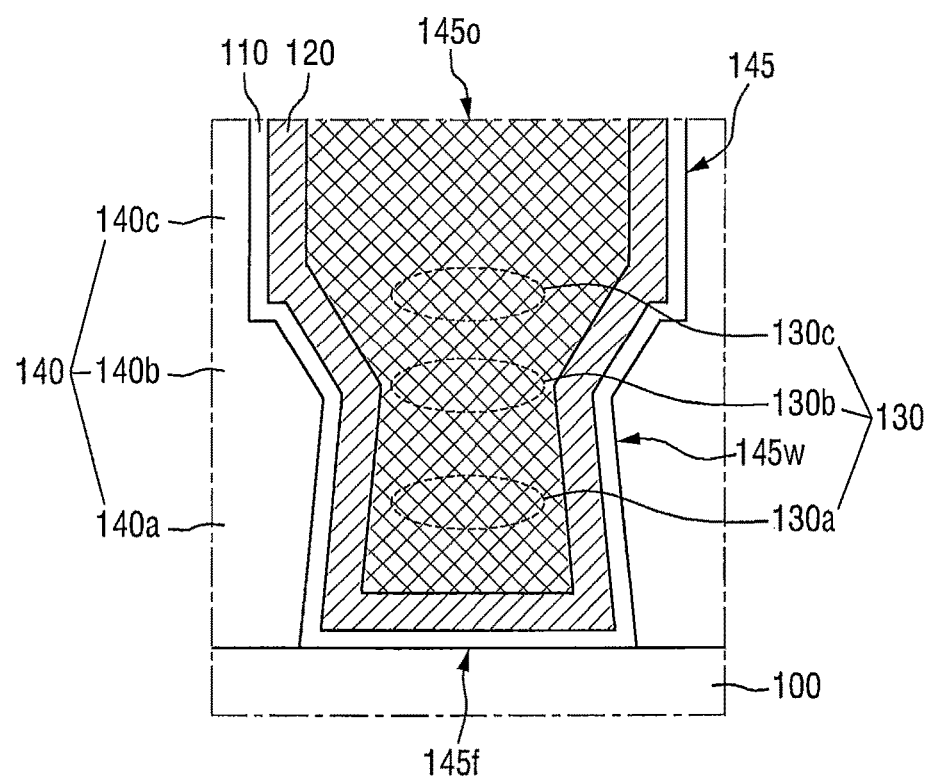

FIGS. 1A and 1B illustrate a semiconductor device according to a first embodiment of the present inventive concepts, FIG. 2 illustrates a gate spacer of FIG. 1, and FIGS. 3A and 3B illustrate shapes of gate electrodes formed on the gate spacer of FIG. 2. In detail, FIG. 1B illustrates a contact formed between gate spacers shown in FIG. 1. FIG. 3A illustrates a lower gate electrode, and FIG. 3B illustrates a state in which a lower gate electrode and an upper gate electrode are formed. In FIGS. 1A and 1B, for the sake of convenient explanation, source/drain regions formed in a substrate and an isolation film, such as a shallow trench isolation (STI), are not illustrated.

Referring to FIGS. 1A and 1B, the semiconductor device 1 according to the first embodiment of the present inventive concepts may include a layer, such as a first gate spacer 140, a first trench 145, a first lower gate electrode 120, a first upper gate electrode 130, a first capping pattern 150 and a first contact 180. The first upper gate electrode 130 and/or the first lower gate electrode 120 may also be referred to herein as a conductive layer 135.

The substrate 100 may be bulk silicon or a silicon-on-insulator (SOI). Alternatively, the substrate 100 may be a silicon substrate, or a substrate made of other materials comprising, for example, germanium, silicon germanium, indium antimonide, lead telluride compound, indium arsenide, indium phosphide, gallium arsenide, and/or gallium antimonide, but aspects of the present inventive concepts are not limited thereto.

The first gate spacer 140 is formed on the substrate 100. The first gate spacer 140 may include, for example, silicon oxide, silicon nitride and/or silicon oxynitride. Since the first gate spacer 140 serves as a guide in forming a self aligned contact, it may include a material having an etching selectivity with respect to first and second interlayer insulation films 182 and 184 to be described later.

The first gate spacer 140 includes an outer surface adjacent to the first interlayer insulation film 182 and an inner surface adjacent to the first lower gate electrode 120. The inner surface of the first gate spacer 140 may be a combination of side surfaces having various angles with respect to the substrate 100. In the semiconductor device 1 according to the first embodiment of the present inventive concepts, the inner surface of the first gate spacer 140 may be shaped of a staircase. In other words, the first gate spacer 140 may be shaped of a bench.

The first gate spacer 140 may include a first part 140a, a second part 140b and a third part 140c sequentially positioned on the substrate 100. A shape of the first gate spacer 140 will later be described in detail with reference to FIG. 2.

The first trench 145 is defined by the first gate spacer 140. The first trench 145 may have an inner surface of the first gate spacer 140 as a side surface or wall 145w of the trench 145, a top surface of the substrate 100 as a bottom surface or floor 145f of the trench 145 and a top surface of the gate spacer 140 as an opening 145o of the trench 145.

The first interlayer insulation film 182 is formed on the substrate 100. The first interlayer insulation film 182 surrounds outer surfaces of the first gate spacer 140, which define the first trench 145. The first interlayer insulation film 182 may include, for example, a low-k material, oxide, nitride and/or oxynitride. The low-k material may include, for example, flowable oxide (FOX), tonen silazene (TOXZ), undoped silicate glass (USG), borosilicate glass (BSG), phosphosilicate glass (PSG), borophosphosilicate glass (BPSG), plasma-enhanced tetraethylorthosilicate (PE-TEOS), fluorosilicate glass (FSG), high density plasma (HDP) oxide, plasma enhanced oxide (PEOX) and/or flowable CVD (FCVD), but is not limited thereto.

As described above, the first interlayer insulation film 182 may include a material having etching selectivity with respect to the first gate spacer 140.

The first gate insulation film 110 may be formed on the inner surface of the first gate spacer 140 and the substrate 100. The first gate insulation film 110 may be formed along side surfaces 145w and a bottom surface 145f of the first trench 145. In the semiconductor device 1 according to the first embodiment of the present inventive concepts, the first gate insulation film 110 formed along the side surfaces 145w of the first trench 145 may be formed along the first part 140a and the second part 140b of the first gate spacer 140 and may extend to a portion of the third part 140c of the first gate spacer 140. That is to say, the first gate insulation film 110 may be formed along portions of the side surfaces 145w and bottom surface 145f of the first trench 145.

The first gate insulation film 110 may include a high-k dielectric film. The high-k dielectric film may include, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and/or lead zinc niobate, but is not limited thereto.

In FIGS. 1A and 1B, the first gate insulation film 110 is formed along the side surfaces 145w and bottom surface 145f of the first trench 145, but aspects of the present inventive concepts are not limited thereto. That is to say, the first gate insulation film 110 may be formed on only the bottom surface 145f of the first trench 145. In the following description, it is assumed that the first gate insulation film 110 is formed along the side surfaces 145w and bottom surface 145f of the first trench 145.

The first lower gate electrode 120 is formed in the first trench 145 having the first gate insulation film 110. The first lower gate electrode 120 may be formed along the side surfaces 145w and bottom surface 145f of the first trench 145, for example, along the first gate insulation film 110. The first lower gate electrode (120, 120s of FIG. 3A) formed along the side surfaces 145w of the first trench 145 passes through the first part 140a and the second part 140b of the first gate spacer 140 to then extend up to a portion of the third part 140c of the first gate spacer 140. That is to say, the first lower gate electrode 120 may be formed along portions of the side surfaces 145w and bottom surface 145f of the first trench 145.

When the semiconductor device 1 is an NMOS device, the first lower gate electrode 120 may include an n type work function control film. The n type work function control film may include, for example, Ti, Ag, Al, TiAl, TiAlN, TiAlC, TaC, TaCN, TaSiN, Mn and/or Zr, but is not limited thereto.

When the semiconductor device 1 is a PMOS device, the first lower gate electrode 120 may include a p type work function control film. The p type work function control film may include, for example, TiN, WN, TaN and/or Ru, but is not limited thereto.

In addition, when the semiconductor device 1 is a PMOS, the first lower gate electrode 120 may include both of the p type work function control film and the n type work function control film. As described above, when the first lower gate electrode 120 has a double layered structure, the p type work function control film may be formed along the side surfaces 145w and bottom surface 145f of the first trench 145 and the n type work function control film may be formed along the side surfaces 145w and bottom surface 145f of the first trench 145 on the p type work function control film.

The shape of the first lower gate electrode 120 formed along the side surfaces 145w and bottom surface 145f of the first trench 145 will later be described in detail with reference to FIG. 3A.

The first upper gate electrode 130 is formed on the first lower gate electrode 120. The first upper gate electrode 130 may fill a portion of the first trench 145. The first upper gate electrode 130 may be a filling gate electrode filling a space remaining after the first lower gate electrode 120 is formed. The first upper gate electrode 130 may be surrounded by the first lower gate electrode 120.

The first upper gate electrode 130 may include, for example, tungsten (W) and/or aluminum (Al), but is not limited thereto.

The shape of the first upper gate electrode 130 filling a portion of the first trench 145 will later be described in detail with reference to FIG. 3B.

In the semiconductor device 1 according to the first embodiment of the present inventive concepts, the first gate electrodes 120 and 130 may include a first lower gate electrode 120 and a first upper gate electrode 130. The first gate electrodes 120 and 130 may fill at least a portion of the first trench 145. In the semiconductor device 1 according to the first embodiment of the present inventive concepts, the first gate electrodes 120 and 130 may fill a portion of the first trench 145.

An uppermost surface of the first upper gate electrode 130 and an uppermost surface of the first lower gate electrode 120 may be coplanar with each other. That is to say, top surfaces of the first gate electrodes 120 and 130 may be planar surfaces.

The top surfaces of the first gate electrodes 120 and 130 are closer to the top surface of the substrate 100 than to the top surface of the first gate spacer 140. In other words, a height ranging from the top surface of the substrate 100 to the top surface of the first gate spacer 140 is greater than a height ranging from the top surface of the substrate 100 to the top surfaces of the first gate electrodes 120 and 130. That is to say, the first gate electrodes 120 and 130 are recessed from the top surface of the first gate spacer 140.

Thereafter, as will later be described in detail with regard to the fabricating method of the semiconductor device, the first upper gate electrode 130 and the first lower gate electrode 120 are formed by forming the first trench 145 by removing a dummy gate electrode and filling the first trench 145. Therefore, the first upper gate electrode 130 and the first lower gate electrode 120 may be replacement metal gate electrodes.

The first capping pattern 150 is formed on the first upper gate electrode 130 and the first lower gate electrode 120. The first capping pattern 150 is formed by filling the portion of the first trench 145. That is to say, since the first gate electrodes 120 and 130 fill the portion of the first trench 145, the first capping pattern 150 fills the remaining portion of the first trench 145, which is not filled by the first gate electrodes 120 and 130.

Since the first capping pattern 150 is formed by filling the portion of the first trench 145 on the first gate electrodes 120 and 130, a top surface of the first capping pattern 150 may be coplanar with the top surface of the first gate spacer 140.

Since the first capping pattern 150 serves as a guide in forming a self aligned contact, it may include a material having an etching selectivity with respect to first and second interlayer insulation films 182 and 184. The first capping pattern 150 may include, for example, silicon nitride (SiN), layer, silicon oxynitride (SiON), silicon oxide (SiO2), silicon carbonitride (SiCN) and/or silicon oxycarbonitride (SiOCN).

In the semiconductor device 1 according to the first embodiment of the present inventive concepts, the first capping pattern 150 does not overlap with the inner surface of the first part 140a of the first gate spacer 140 and the inner surface of the second part 140b of the first gate spacer 140. That is to say, the side surfaces of the first capping pattern 150 may face the inner surface of the third part 140c of the first gate spacer 140.

In addition, the first gate insulation film 110 and the first lower gate electrode 120 formed on the side surfaces of the first trench 145 extend up to a portion of the third part 140c of the first gate spacer 140. Therefore, the first gate insulation film 110 and the first lower gate electrode 120 are not positioned between the first capping pattern 150 and the first gate spacer 140.

The second interlayer insulation film 184 is formed on the first interlayer insulation film 182. The second interlayer insulation film 184 covers the first capping pattern 150 and the first gate spacer 140. The first interlayer insulation film 182 may include, for example, a low-k material, oxide, nitride and/or oxynitride. The second interlayer insulation film 184 may include a material having etching selectivity with respect to the first gate spacer 140 and the first capping pattern 150.

The first contact 180 may be formed in the first interlayer insulation film 182 and the second interlayer insulation film 184. The first contact 180 may be, for example, a self-aligned contact. That is to say, the first contact 180 may be aligned by the first capping pattern 150 and the first gate spacer 140 having etching resistance with respect to the first interlayer insulation film 182 and the second interlayer insulation film 184.

The first contact 180 may be formed to be adjacent to the first gate spacer 140. In FIG. 1B, a surface to which the first contact 180 and the first gate spacer 140 are adjacent is illustrated as a tilted surface, which is, however, provided for the sake of convenient explanation, but aspects of the present inventive concepts are not limited thereto. The first contact 180 may overlap with at least a portion of the first gate spacer 140.

The first contact 180 may include, for example, aluminum (Al), tungsten (W) and/or copper (Cu), but is not limited thereto.

FIG. 2 illustrates a shape of a first gate spacer. For the sake of convenient explanation, the first gate spacer 140 and the substrate 100 are illustrated.

Referring to FIG. 2, the first gate spacer 140 defining the first trench 145 is formed on the substrate 100. The first gate spacer 140 may include a first part 140a and a second part 140b.

The first part 140a of the first gate spacer 140 and the second part 140b of the first gate spacer 140 are sequentially positioned on the substrate 100. That is to say, the first part 140a of the first gate spacer 140 is closest to the substrate 100, and the second part 140b of the first gate spacer 140 is farther from the substrate 100 than the first part 140a of the first gate spacer 140.

The first part 140a of the first gate spacer 140 has an outer surface adjacent to the first interlayer insulation film 182 and an inner surface forming a side surface 145w of the first trench 145. The inner surface of the first part 140a of the first gate spacer 140 has a slope of $\theta 1$. Here, "the slope of the inner surface" means an angle formed by the inner surface and the top surface of the substrate 100. In semiconductor devices according to embodiments of the present inventive concepts, the slope $\theta 1$ of the inner surface of the first part 140a of the first gate spacer 140 is an acute angle. That is to say, the angle $\theta 1$ formed by the inner surface of the first gate spacer 140, which is closest to the substrate 100, and the top surface of the substrate 100 is an acute angle.

The second part 140b of the first gate spacer 140 has an outer surface adjacent to the first interlayer insulation film 182 and an inner surface forming a side surface of the first trench 145. The inner surface of the second part 140b of the first gate spacer 140 has a slope of $\theta 2$. The slope $\theta 2$ of the inner surface of the second part 140b of the first gate spacer 140 is a right angle or an obtuse angle. In the semiconductor device according to the first embodiment of the present inventive concepts, the angle $\theta 2$ formed by the inner surface of the first part 140a of the first gate spacer 140 and the substrate 100 is an obtuse angle.

The first part 140a of the first gate spacer 140 and the second part 140b of the first gate spacer 140 are connected to each other. Therefore, the slope of the inner surface of the first gate spacer 140 changes from an acute angle to an obtuse angle at a boundary point at which the inner surface of the first part 140a of the first gate spacer 140 and the inner surface of the second part 140b of the first gate spacer 140 meet. In the semiconductor device according to the first embodiment of the present inventive concepts, the boundary point at which the inner surface of the first part 140a of the first gate spacer 140 and the inner surface of the second part 140b of the first gate spacer 140 meet is a point at which signs of the slope of the inner surface of the first gate spacer 140 change.

The slope of the inner surface of the first gate spacer 140 changes at the boundary point at which the inner surface of the first part 140a of the first gate spacer 140 and the inner surface of the second part 140b of the first gate spacer 140 meet. However, the inner surface of the first part 140a of the first gate spacer 140 and the inner surface of the second part 140b of the first gate spacer 140 have a continuous profile. In other words, there is no step between them.

The first part 140a of the first gate spacer 140 has a height of h1, and the second part 140b of the first gate spacer 140 has a height of h2. In the semiconductor devices according to embodiments of the present inventive concepts, a height h1 of the first part 140a of the first gate spacer 140 is greater than a height h2 of the second part 140b of the first gate spacer 140.

Since the inner surface of the first part 140a of the first gate spacer 140 has a slope of an acute angle, a width w of the first trench 145 defined by the first part 140a of the first gate spacer 140 gradually decreases as the inner surface of the first part 140a of the first gate spacer 140 becomes distant from the substrate 100.

Conversely, since the inner surface of the second part 140b of the first gate spacer 140 has a slope of an obtuse angle, a width w of the first trench 145 defined by the second part 140b of the first gate spacer 140 gradually increases as the inner surface of the first part 140a of the first gate spacer 140 becomes distant from the substrate 100.

Referring to FIG. 2, the first gate spacer 140 may further includes a third part 140c positioned on the second part 140b of the first gate spacer 140. That is to say, the first to third parts 140a, 140b and 140c of the first gate spacer 140 are sequentially positioned on the substrate 100.

The second part 140b of the first gate spacer 140 and the third part 140c of the first gate spacer 140 may be connected to each other. However, the inner surface of the second part 140b of the first gate spacer 140 and an inner surface of the third part 140c of the first gate spacer 140 have a discontinuous profile. In other words, a step is present between them.

The second part 140b of the first gate spacer 140 and the third part 140c of the first gate spacer 140 may have a terrace shape.

By terrace surface, the inner surface of the second part 140b of the first gate spacer 140 and the inner surface of the third part 140c of the first gate spacer 140 have a discontinuous profile by the terrace surface.

Since the inner surface of the second part 140b of the first gate spacer 140 and the inner surface of the third part 140c of the first gate spacer 140 have a discontinuous profile, the width w of the first trench 145 defined by the second part 140b of the first gate spacer 140 is different from the width w of the first trench 145 defined by the third part 140c of the first gate spacer 140 at a boundary point at which the second part 140b of the first gate spacer 140 and the third part 140c meet. In the semiconductor device according to the first embodiment of the present inventive concepts, the width w of the first trench 145 defined by the third part 140c of the first gate spacer 140 is greater than the width w of the first trench 145 defined by the second part 140b of the first gate spacer 140.

The inner surface of the first gate spacer 140 includes a first point, a second point and a third point sequentially disposed away from the substrate 100. The first point is positioned on the inner surface of the first part 140a of the first gate spacer 140. The second point is a point at which the first part 140a of the first gate spacer 140 and the second part 140b of the first gate spacer 140 are connected to each other. That is to say, the second point is a point at which the slope of the inner surface of the first gate spacer 140 changes from an acute angle to an obtuse angle. The third point is positioned on the inner surface of the second part 140b of the first gate spacer 140 or the inner surface of the third part 140c. In FIG. 2, the third point positioned on the inner surface of the third part 140c of the first gate spacer 140, but aspects of the present inventive concepts are not limited thereto.

At the first point, the width w of the first trench 145 is w1. At the second point, the width w of the first trench 145 is w2. At the third point, the width w of the first trench 145 is w3. In the semiconductor device according to the first embodiment of the present inventive concepts, the width w1 of the first trench 145 at the first point is greater than the width w2 of the first trench 145 at the second point. In addition, the width w3 of the first trench 145 at the third point is greater than the width w2 of the first trench 145 at the second point. That is to say, the width w2 of the first trench 145 is narrowest at the second point at which the slope of the inner surface of the first gate spacer 140 changes from an angle to an obtuse angle. The distance between the inner surfaces of the first gate spacer 140 is closest at the second point.

Referring to FIG. 3A, the first lower gate electrode 120 is formed along the side surfaces 145w and bottom surface 145f of the first trench 145 defined by the first gate spacer 140.

The first lower gate electrode 120 includes a bottom surface 120b formed on a bottom 145f of the first trench 145 and side surfaces 120s formed on the side surfaces 145w of the first trench 145. The bottom surface 120b of the first lower gate electrode 120 is formed along the top surface of the substrate 100, and the side surfaces 120s of the first lower gate electrode 120 is formed along the inner surface of the first gate spacer 140. The side surfaces 120s of the first lower gate electrode 120 are connected to the bottom surface 120b of the first lower gate electrode 120.

The side surfaces 120s of the first lower gate electrode 120 include a first part 120s-1, a second part 120s-2 and a third part 120s-3. The first part 120s-1 of the side surface 120s of the first lower gate electrode 120 is positioned to be closest to the substrate 100. That is to say, the first part 120s-1 is connected to the bottom surface 120b of the first lower gate electrode 120.

Since the first part 120s-1 of the side surfaces 120s of the first lower gate electrode 120 has a slope θ3 of an acute angle, and the second part 120s-2 has a slope θ4 of an obtuse angle. Since the first part 120s-1 is formed along the inner surface of the first part 140a of the first gate spacer 140, the first part 120s-1 has a slope of an acute angle. Conversely, since the second part 120s-2 is formed along the inner surface of the second part 140b of the first gate spacer 140, the second part 120s-2 has a slope of an obtuse angle. The third part 120s-3 is formed along the third part 140c of the first gate spacer 140.

Since the side surfaces 120s of the first lower gate electrode 120 are formed along the inner surface of the first gate spacer 140, the side surfaces 120s of the first lower gate electrode 120 face each other.

The side surfaces 120s of the first lower gate electrode 120 has a fourth point, a fifth point and a sixth point sequentially disposed to be away from the substrate 100. The fourth point is positioned on the first part 120s-1. The fifth point is a point at which the first part 120s-1 and the second part 120s-2 are connected to each other. That is to say, the fifth point is a point at which the slope of the side surfaces 120s of the first lower gate electrode 120 changes from an acute angle to an obtuse angle. The sixth point is positioned on the second part 120s-2 or the third part 120s-3. In FIG. 2, the sixth point is positioned on the third part 120s-3 of the side surfaces 120s of the first lower gate electrode 120, but aspects of the present inventive concepts are not limited thereto.

At the fourth point, a distance between the facing side surfaces 120s of the first lower gate electrode 120 is L1. At the fifth point, a distance between the facing side surfaces 120s of the first lower gate electrode 120 is L2. At the sixth point, a distance between the facing side surfaces 120s of the first lower gate electrode 120 is L3. In the semiconductor device 1 according to the first embodiment of the present inventive concepts, the distance L1 between the side surfaces 120s of the first lower gate electrode 120 at the fourth point is greater than the distance L2 between the side surfaces 120s of the first lower gate electrode 120 at the fifth point. In addition, the distance L3 between the side surfaces 120s of the first lower gate electrode 120 at the sixth point is greater than the distance L2 between the side surfaces 120s of the first lower gate electrode 120 at the fifth point. That is to say, at the fifth point at which the slope of the side surfaces 120s of the first lower gate electrode 120 changes from an acute angle to an obtuse angle, the facing side surfaces 120s of the first lower gate electrode 120 are closest to each other.

Referring to FIG. 3B, the first upper gate electrode 130 fills a portion of the first trench 145 defined by the first gate spacer 140.

The side surfaces of the first upper gate electrode 130 have substantially the same shapes as the first lower gate electrode 120 formed on the side surfaces of the first trench 145. That is to say, the side surfaces of the first upper gate electrode 130 may include a part having a slope of an acute angle and a part having a slope of an obtuse angle.

The first upper gate electrode 130 may include a first part 130a and a second part 130b. The first part 130a of the first upper gate electrode 130 is closer to the substrate 100 than the second part 130b of the first upper gate electrode 130.

The first part 130a of the first upper gate electrode 130 is positioned between the first part 140a of the first gate spacer 140. The second part 130b of the first upper gate electrode 130 is positioned between points at which the slopes of the side surfaces of the first lower gate electrode 120 change from an acute angle to an obtuse angle.

A width of the first part 130a of the first upper gate electrode 130 is greater than a width of the second part 130b of the first upper gate electrode 130.

The first upper gate electrode 130 further includes a third part 130c. The second part 130b of the first upper gate electrode 130 is closer to the substrate 100 than the third part 130c of the first upper gate electrode 130.

The width of the third part 130c of the first upper gate electrode 130 is greater than the width of the second part 130b of the first upper gate electrode 130.

In conclusion, the width of the first part 130a of the first upper gate electrode 130 is greater than the width of the second part 130b of the first upper gate electrode 130, and the width of the third part 130c of the first upper gate electrode 130 is greater than the width of the second part 130b of the first upper gate electrode 130. In other words, the width of the first upper gate electrode 130 decreases to reach a given point to then increase again.

In the semiconductor devices according to the embodiments of the present inventive concepts, widths of the first gate electrodes 120 and 130 gradually decrease to reach a predetermined height of the substrate 100. However, the widths of the first gate electrodes 120 and 130 increase again after passing points at which the widths of the first gate electrodes 120 and 130 become smallest.

In the semiconductor devices according to the embodiments of the present inventive concepts, the first gate electrodes 120 and 130 may include both of trapezoidal parts and inversely trapezoidal parts.

FIGS. 1A-3B also illustrate other aspects of the present inventive concepts. Specifically, these figures illustrate a semiconductor device that comprises a layer, such as the first gate spacer 140, on a substrate 100. The layer, includes a trench 145 therein, that comprises a trench opening 145o remote from the substrate, a trench floor or bottom 145f adjacent the substrate 100, and a trench side or wall 145w between the trench opening 145o and the trench floor 145f. As illustrated in these figures, the trench wall 145w is pinched relative to the trench opening 145o and the trench floor 145f. A conductive layer 135, which may include the first upper gate electrode 130 and/or the first lower gate electrode 120, is also provided in the trench 145. The conductive layer 135 includes a conductive layer top 135t adjacent the trench opening 145o, a conductive layer bottom 135b adjacent the trench floor 145f and a conductive layer wall 135w between the conductive layer top 135t and the conductive layer bottom 135b. The conductive layer wall 135w is also pinched relative to the conductive layer top 135t and the conductive layer bottom 135b. Moreover, the conductive layer top 135t may be recessed from the trench opening 145o, and the semiconductor device may further comprise a second conductive layer, such as the first capping pattern 150, in the trench 145 on the conductive layer top 135t, and extending to the trench opening 145o. Moreover, in some embodiments, the layer 140 is a unitary insulating layer. These aspects are also illustrated in the figures which follow.

The following embodiment shown in FIGS. 4 to 6 will now be described, except for a contact passing through an interlayer insulation film.

A semiconductor device according to a second embodiment of the present inventive concepts will be described with reference to FIG. 4. For the sake of convenient explanation, the following description will focus on differences between the semiconductor device shown in FIG. 1A and the semiconductor device shown in FIG. 4.

Figure 4:
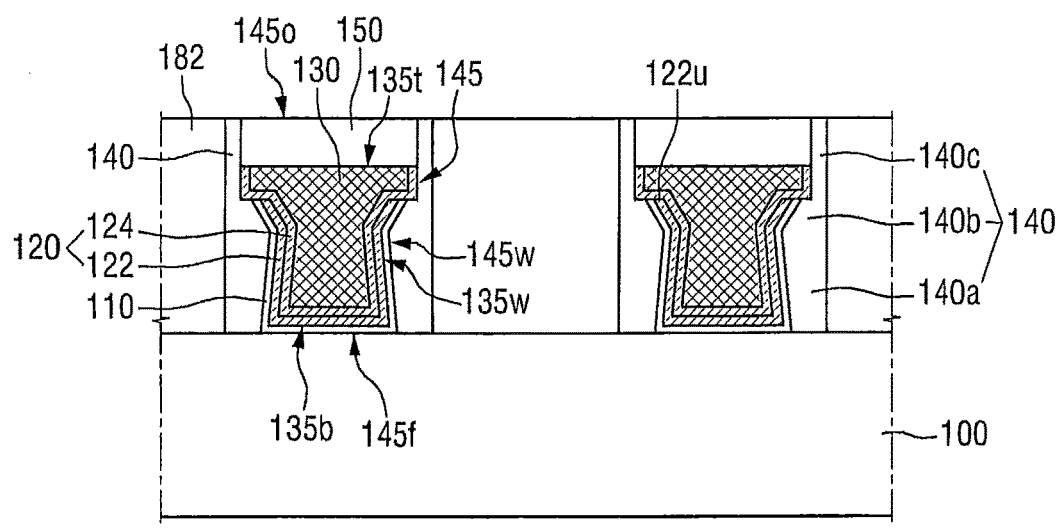
FIG. 4 illustrates a semiconductor device according to a second embodiment of the present inventive concepts.

FIG. 4 illustrates a semiconductor device according to a second embodiment of the present inventive concepts.

Referring to FIG. 4, the first gate insulation film 110 is formed along portions of side surfaces 145w and a bottom surface 145f of the first trench 145. The first lower gate electrode 120 is formed along the first gate insulation film 110. The first lower gate electrode 120 may include a first film 122 and a second film 124.

A first gate insulation film 110 formed on the side surfaces 145w of the first trench 145 may extend from the first part 140a of the first gate spacer 140 to the second part 140b of the first gate spacer 140. The first gate insulation film 110 formed on the side surfaces 145w of the first trench 145 may not contact the first capping pattern 150 but may be spaced apart from the first capping pattern 150 in a thickness of a substrate 100. In FIG. 4, the first gate insulation film 110 not extending up to the third part 140c of the first gate spacer 140 is illustrated, but aspects of the present inventive concepts are not limited thereto. That is to say, a portion of the first lower gate electrode 120 formed on the side surfaces 145w of the first trench 145 may overlap with a portion of the third part 140c of the first gate spacer 140.

The first film 122 and the second film 124 included in the first lower gate electrode 120 are sequentially stacked on the first gate insulation film 110. The first film 122 of the first lower gate electrode 120 may be, for example, a p type work function control film, and the second film 124 of the first lower gate electrode 120 may be, for example, an n type work function control film.

Portions of the first film 122 of the first lower gate electrode 120, which are formed on the side surfaces 145w of the first trench 145, may extend from the first part 140a of the first gate spacer 140 to the second part 140b of the first gate spacer 140. The first film 122 of the first lower gate electrode 120 may not contact the first capping pattern 150 but may be spaced apart from the first capping pattern 150 in the thickness direction of the substrate 100. In FIG. 4, the first film 122 of the first lower gate electrode 120 not extending up to the third part 140c of the first gate spacer 140 is exemplified, but aspects of the present inventive concepts are not limited thereto. That is to say, the portions of the first film 122 of the first lower gate electrode 120, which are formed on the side surfaces 145w of the first trench 145, may overlap with a portion of the third part 140c of the first gate spacer 140. However, the first film 122 of the first lower gate electrode 120 may be formed to have any shape without particular limitation so long as it is spaced apart from the first capping pattern 150 without making contact with the first capping pattern 150. In other words, an uppermost surface 122u of the first film 122 of the first lower gate electrode 120 is spaced apart from the first capping pattern 150.

Portions of the second film 124 of the first lower gate electrode 120, which are formed on the side surfaces 145w of the first trench 145, may extend from the first part 140a of the first gate spacer 140 to a portion of the third part 140c of the first gate spacer 140. That is to say, the second film 124 of the first lower gate electrode 120, which are formed on the side surfaces of the first trench 145, overlaps with a portion of the third part 140c of the first gate spacer 140. At the portion where the first film 122 of the first lower gate electrode 120 is formed, the second film 124 of the first lower gate electrode 120 is formed along the first film 122 of the first lower gate electrode 120. However, at the portion where the first film 122 of the first lower gate electrode 120 is not formed, the second film 124 of the first lower gate electrode 120 is formed along the side surfaces of the first gate spacer 140.

In some embodiments, the second film 124 of the first lower gate electrode 120 entirely covers the first film 122 of the first lower gate electrode 120. In other words, in some embodiments, the second film 124 of the first lower gate electrode 120 covers the uppermost surface 122u of the first film 122 of the first lower gate electrode 120.

A semiconductor device according to a third embodiment of the present inventive concepts will be described with reference to FIG. 5. For the sake of convenient explanation, the following description will focus on differences between the semiconductor device shown in FIG. 1A and the semiconductor device shown in FIG. 5.

Figure 5:
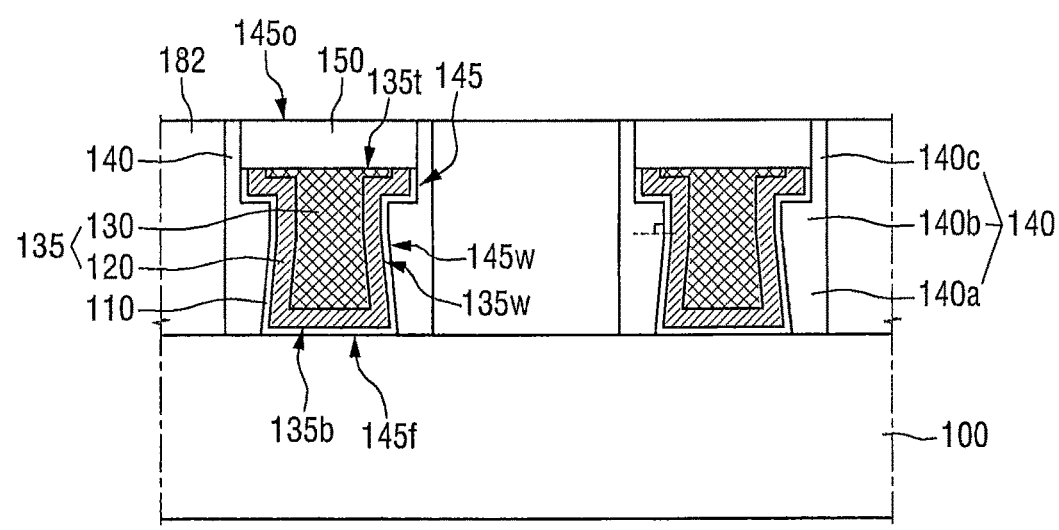
FIG. 5 illustrates a semiconductor device according to a third embodiment of the present inventive concepts.

FIG. 5 illustrates a semiconductor device according to a third embodiment of the present inventive concepts.

Referring to FIG. 5, a first gate spacer 140 includes a first part 140a, a second part 140b and a third part 140c sequentially positioned on the substrate 100.

The inner surface of the first part 140a of the first gate spacer 140 has a slope of an acute angle. The inner surface of the second part 140b of the first gate spacer 140 has a slope of a right angle. That is to say, the inner surface of the second part 140b of the first gate spacer 140 is parallel to a normal of the substrate 100.

In FIG. 5, the inner surface of the second part 140b of the first gate spacer 140 having a slope of a right angle is directly connected to the third part 140c of the first gate spacer 140, but aspects of the present inventive concepts are not limited thereto. That is to say, the first gate spacer 140 may further include a part of the inner surface having a slope of an obtuse angle between the second part 140b of the first gate spacer 140 and the third part 140c of the first gate spacer 140.

In the semiconductor device according to the third embodiment of the present inventive concepts, the first trench 145 defined by the second part 140b of the first gate spacer 140 may have a constant a width w.

In the semiconductor device according to the third embodiment of the present inventive concepts, the first lower gate electrode 120 formed along the second part 140b of the first gate spacer 140 may have a constant width.

A semiconductor device according to a fourth embodiment of the present inventive concepts will be described with reference to FIG. 6. For the sake of convenient explanation, the following description will focus on differences between the semiconductor device shown in FIG. 1A and the semiconductor device shown in FIG. 6

Figure 6:
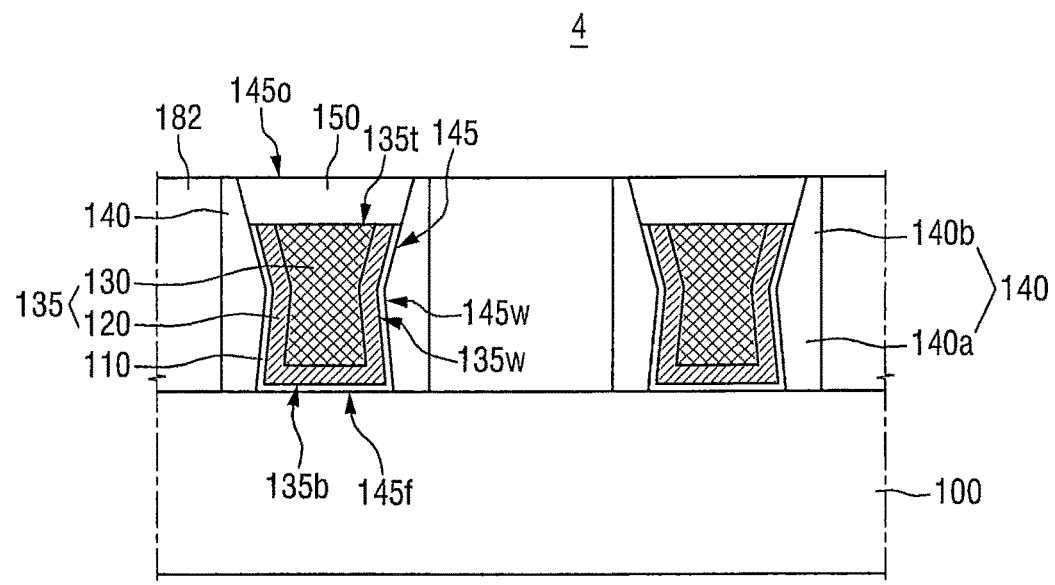
FIG. 6 illustrates a semiconductor device according to a fourth embodiment of the present inventive concepts.

FIG. 6 illustrates a semiconductor device according to a fourth embodiment of the present inventive concepts.

Referring to FIG. 6, a first gate spacer 140 includes a first part 140a and a second part 140b sequentially positioned on a substrate.

An inner surface of the first part 140a of the first gate spacer 140 and an inner surface of the second part 140b of the first gate spacer 140 have a continuous profile. In addition, the profile of the inner surface of the first gate spacer 140 is entirely continuous. That is to say, the inner surface of the first gate spacer 140 does not have a terrace surface.

A first gate insulation film 110 and a first lower gate electrode 120 formed on side surfaces of a first trench 145 may extend from the first part 140a of the first gate spacer 140 to a portion of the second part 140b of the first gate spacer 140.

The first capping pattern 150 fills the remaining portion of the first trench 145 partially filled by the first gate electrodes 120 and 130. The first capping pattern 150 may not overlap with the first part 140a of the first gate spacer 140 but may overlap with a portion of the second part 140b of the first gate spacer 140, on the inner surface of the first gate spacer 140.

A semiconductor device according to a fifth embodiment of the present inventive concepts will be described with reference to FIG. 7. For the sake of convenient explanation, the following description will focus on differences between the semiconductor device shown in FIGS. 1A 1B and the semiconductor device shown in FIG. 7.

Figure 7:
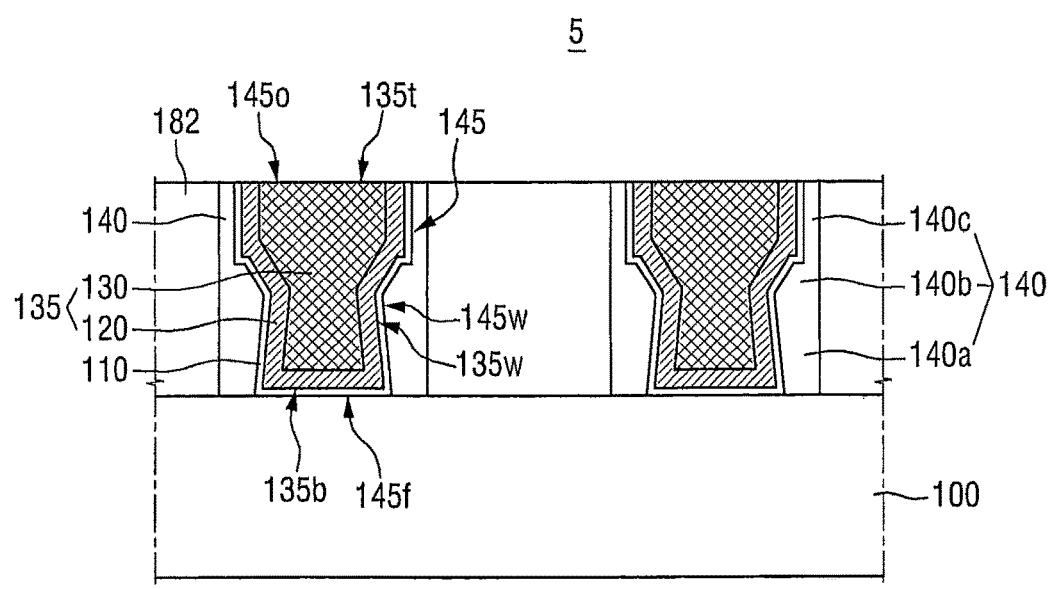
FIG. 7 illustrates a semiconductor device according to a fifth embodiment of the present inventive concepts.

FIG. 7 illustrates a semiconductor device according to a fifth embodiment of the present inventive concepts.

Referring to FIG. 7, a top surface of a first upper gate electrode 130 and an uppermost surface of a first lower gate electrode 120 are coplanar with a top surface of a first interlayer insulation film 182. That is to say, a first capping pattern (150 of FIG. 1A) filling a portion of a first trench 145 may not be formed on the first upper gate electrode 130 and the first lower gate electrode 120.

The first lower gate electrode 120 is formed along side surfaces and a bottom surface of the first trench 145. The first lower gate electrode 120 formed on the side surfaces 145w of the first trench 145 extends from the first part 140a of the first gate spacer 140 to the third part 140c of the first gate spacer 140. That is to say, the first lower gate electrode 120 may entirely overlap with the first gate spacer 140 on the inner surface of the first gate spacer 140.

Unlike in FIG. 1B, in the semiconductor device according to the fifth embodiment of the present inventive concepts, the first gate electrodes 120 and 130 and the first gate spacer 140 serving as a guide in forming a self aligned contact may not be formed.

A semiconductor device according to the sixth embodiment of the present inventive concepts will be described with reference to FIG. 8. For the sake of convenient explanation, descriptions of overlapping content from the first to fifth embodiments shown in FIGS. 1A to 7 will be briefly made or omitted.

Figure 8:
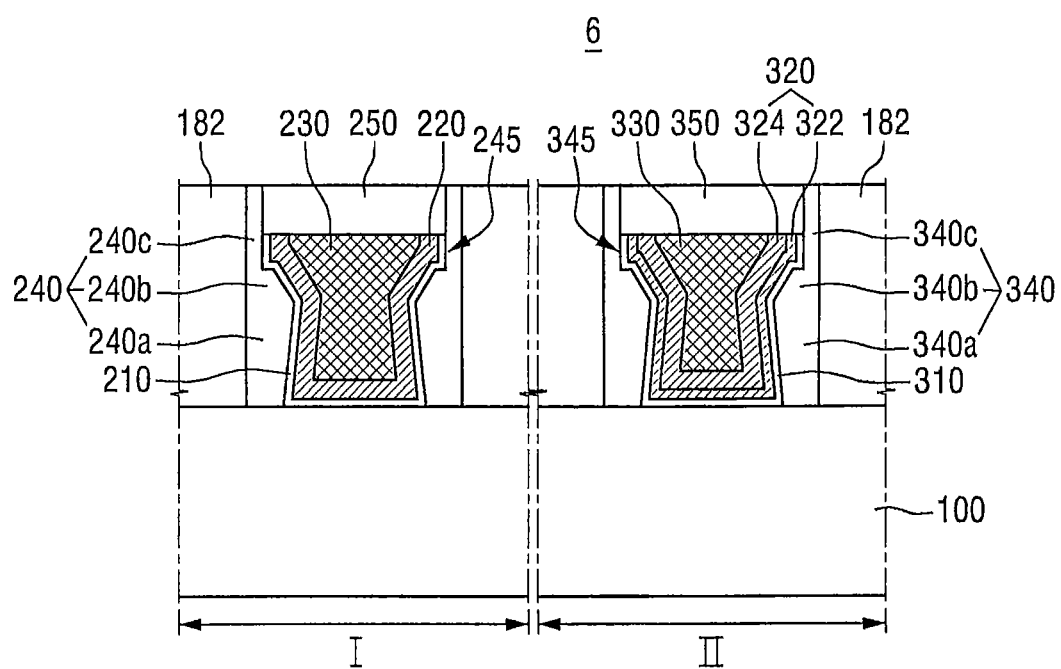
FIG. 8 illustrates a semiconductor device according to a sixth embodiment of the present inventive concepts.

FIG. 8 illustrates a semiconductor device according to a sixth embodiment of the present inventive concepts.

Referring to FIG. 8, semiconductor device 6 according to the sixth embodiment of the present inventive concepts includes a second gate spacer 240, a third gate spacer 340, a second trench 245, a third trench 345, a second lower gate electrode 220, a third lower gate electrode 320, a second upper gate electrode 230, a third upper gate electrode 330, a second capping pattern 250 and a third capping pattern 350.

A substrate 100 may include a first region I and a second region II. The first region I and the second region II may be disconnected from each other or may be connected to each other. In the semiconductor device according to the sixth embodiment of the present inventive concepts, the first region I may be a region where an NMOS device is formed, and the second region II may be a region where a PMOS device is formed.

The second gate spacer 240 and the third gate spacer 340 are formed on the first region I and the second region II of the substrate 100. Therefore, the second trench 245 defined by the second gate spacer 240 is positioned on the first region I, and the third trench 345 defined by the third gate spacer 340 is positioned on the second region II.

The second gate spacer 240 may include a first part 240a, a second part 240b and a third part 240c sequentially positioned on the substrate 100 of the first region I. The third gate spacer 340 may include a first part 340a, a second part 340b and a third part 340c sequentially positioned on the substrate 100 of the second region II.

The inner surface of the first part 240a of the second gate spacer 240 and the inner surface of the first part 340a of the third gate spacer 340 may have a slope of an acute angle. However, the inner surface of the second part 240b of the second gate spacer 240 and the inner surface of the second part 340b of the third gate spacer 340 may have a slope of an obtuse angle or a right angle. In FIG. 8, the inner surface of the second part 240b of the second gate spacer 240 and the inner surface of the second part 340b of the third gate spacer 340 having a slope of an obtuse angle are illustrated, but aspects of the present inventive concepts are not limited thereto.

The inner surface of the first part 240a of the second gate spacer 240 and the inner surface of the second part 240b of the second gate spacer 240 have a continuous profile. However, the inner surface of the second part 240b of the second gate spacer 240 and the inner surface of the third part 240c of the second gate spacer 240 have a discontinuous profile. The profile of the inner surface of the second gate spacer 240 has a continuous part and a discontinuous part.

Likewise, the inner surface of the second part 340b of the third gate spacer 340 and an inner surface of the first part 340a of the third gate spacer 340 have a continuous profile, and the inner surface of the second part 340b of the third gate spacer 340 and the inner surface of the third part 340c of the third gate spacer 340 have a discontinuous profile.

The second gate insulation film 210 is formed along portions of side surfaces and a bottom surface of the second trench 245, and the third gate insulation film 310 is formed along portions of side surfaces and a bottom surface of the third trench 345. The second gate insulation film 210 and the third gate insulation film 310 formed on the side surfaces of the second trench 245 and the side surfaces of the third trench 345 overlap with a portion of the third part 240c of the second gate spacer 240 and a portion of the third part 340c of the third gate spacer 340.

The second lower gate electrode 220 is formed along the portions of the side surfaces and the bottom surface of the second trench 245 on the second gate insulation film 210. That is to say, the second lower gate electrode 220 formed on the side surfaces of the second trench 245 overlaps a portion of the third part 240c of the second gate spacer 240.

The second lower gate electrode 220 may include a first n type work function control film but may not include a p type work function control film.

The third lower gate electrode 320 may include a first film 322 and a second film 324. The first film 322 of the third lower gate electrode 320 may include a p type work function control film, and the second film 324 of the third lower gate electrode 320 may include a second n type work function control film. The first n type work function control film included in the second lower gate electrode 220 and the second n type work function control film included in the third lower gate electrode 320 are formed on the same level. Here, the expression "the same level" means that two elements or layers are formed by the same fabricating process.

The first film 322 of the third lower gate electrode 320 is formed along the portions of the side surfaces and bottom surface of the second trench 245 on the third gate insulation film 310. The second film 324 of the third lower gate electrode 320 is formed along the first film 322 of the third lower gate electrode 320. That is to say, the first film 322 and the second film 324 of the third lower gate electrode 320 formed on the side surfaces of the third trench 345 may overlap with a portion of the third part 340c of the third gate spacer 340.

The second film 324 of the third lower gate electrode 320 does not cover an uppermost surface of the first film 322 of the third lower gate electrode 320. The second film 324 of the third lower gate electrode 320 does not entirely cover the first film 322 of the third lower gate electrode 320.

A thickness of the third lower gate electrode 320 formed along the side surfaces and bottom surface of the third trench 345 is greater than that of the second lower gate electrode 220 by a thickness of the first film 322 of the third lower gate electrode 320.

The second upper gate electrode 230 and the third upper gate electrode 330 are formed on the second lower gate electrode 220 and the third lower gate electrode 320, respectively. The second upper gate electrode 230 and the third upper gate electrode 330 may fill a portion of the second trench 245 and at least a portion of the third trench 345, respectively. That is to say, the second upper gate electrode 230 and the third upper gate electrode 330 may be a first filling gate electrode and a second filling gate electrode, respectively.

In conclusion, the second gate electrodes 220 and 230 and the third gate electrodes 320 and 330 may fill at least portions of the second trench 245 and the third trench 345, respectively.

In the semiconductor device according to the sixth embodiment of the present inventive concepts, the second gate electrodes 220 and 230 and the third gate electrodes 320 and 330 fill portions of the second trench 245 and the third trench 345.

The second capping pattern 250 the third capping pattern 350 are formed on the second gate electrodes 220 and 230 and the third gate electrodes 320 and 330, respectively. The second capping pattern 250 and the third capping pattern 350 are formed by filling the portions of the second trench 245 and the third trench 345, respectively. That is to say, the second capping pattern 250 may fill the portions remaining after the second gate electrodes 220 and 230 fill the second trench 245.

Here, the semiconductor device 6 may further include self-aligned contacts adjacent to the second gate spacer 240 and the third gate spacer 340, respectively.

A semiconductor device according to a seventh embodiment of the present inventive concepts will be described with reference to FIG. 9. For the sake of convenient explanation, the following description will focus on differences between the semiconductor device shown in FIG. 8 and the semiconductor device shown in FIG. 9.

Figure 9:
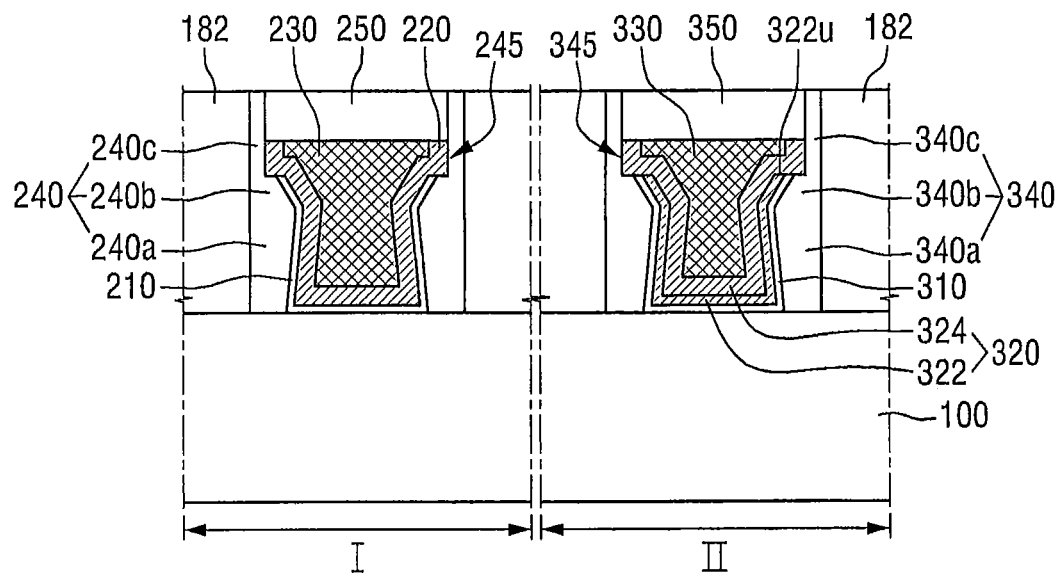
FIG. 9 illustrates a semiconductor device according to a seventh embodiment of the present inventive concepts.

FIG. 9 illustrates a semiconductor device according to a seventh embodiment of the present inventive concepts.

Referring to FIG. 9, a second gate insulation film 210 is formed along portions of side surfaces and a bottom surface of a second trench 245. A third gate insulation film 310 is formed along portions of side surfaces and a bottom surface of a third trench 345.

The second gate insulation film 210 formed on the side surfaces of the second trench 245 may extend from a first part 240a of a second gate spacer 240 to a second part 240b of the second gate spacer 240. The third gate insulation film 310 formed on the side surfaces of the third trench 345 may extend from a first part 340a of the third gate spacer 340 to a second part 340b of the third gate spacer 340. Unlike in FIG. 9, the second gate insulation film 210 and/or the third gate insulation film 310 formed on the side surfaces of the second trench 245 and the third trench 345 may overlap with a portion of a third part 240c of the second gate spacer 240 and a portion of the third part 340c of the third gate spacer 340.

Portions of a first film 322 of the third lower gate electrode 320, which are formed on the side surfaces of the third trench 345, may extend from the first part 340a of the third gate spacer 340 to the second part 340b of the third gate spacer 340. The first film 322 of the third lower gate electrode 320 may not contact a third capping pattern 350 but may be spaced apart from the third capping pattern 350 in a thickness direction of a substrate 100.

A second film 324 of the third lower gate electrode 320 entirely covers the first film 322 of the third lower gate electrode 320. In other words, the second film 324 of the third lower gate electrode 320 covers an uppermost surface 322u of the first film 322 of the third lower gate electrode 320.

A semiconductor device according to an eighth embodiment of the present inventive concepts will be described with reference to FIG. 10. For the sake of convenient explanation, the following description will focus on differences between the semiconductor device shown in FIG. 8 and the semiconductor device shown in FIG. 10.

Figure 10:
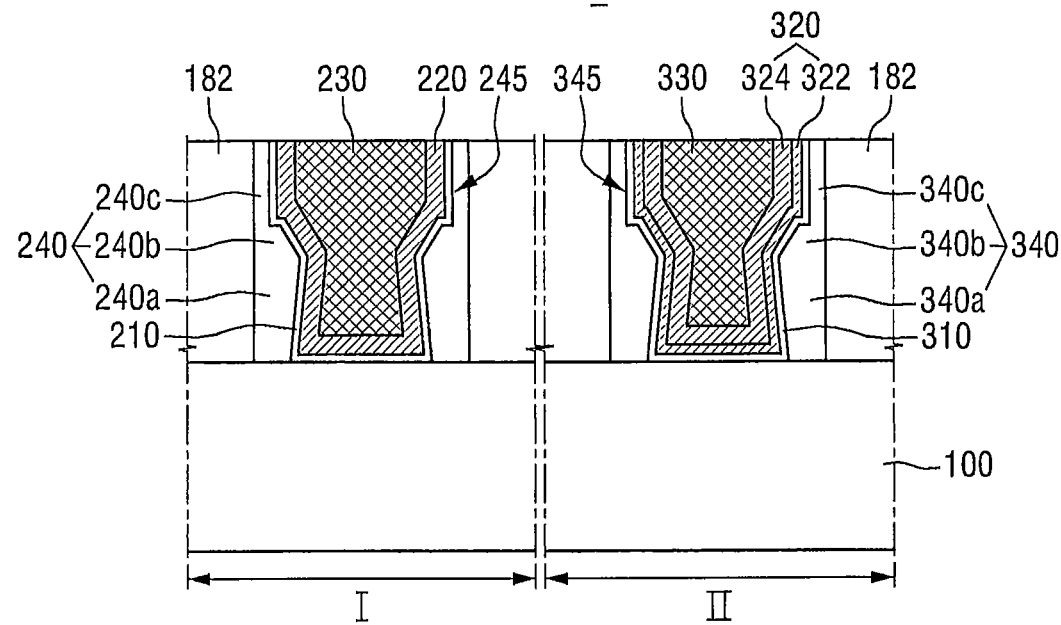
FIG. 10 illustrates a semiconductor device according to an eighth embodiment of the present inventive concepts.

FIG. 10 illustrates a semiconductor device according to an eighth embodiment of the present inventive concepts.

Referring to FIG. 10, an uppermost surface of a second upper gate electrode 230 and an uppermost surface of a second lower gate electrode 220 are coplanar with an uppermost surface of a first interlayer insulation film 182. In addition, an uppermost surface of a third upper gate electrode 330 and an uppermost surface of a third lower gate electrode 320 are coplanar with an uppermost surface of a first interlayer insulation film 182.

The uppermost surfaces of the second gate electrodes 220 and 230 and the uppermost surfaces of the third gate electrodes 320 and 330 are not recessed from the top surface of the first interlayer insulation film 182. Therefore, the second gate electrodes 220 and 230 and the third gate electrodes 320 and 330 may entirely fill a second trench 245 and a third trench 345, respectively.

A second capping pattern (250 of FIG. 8) and a third capping pattern (350 of FIG. 8) filling a portion of the second trench 245 and a portion of the third trench 345 are not formed on the second gate electrodes 220 and 230 and the third gate electrodes 320 and 330, respectively.

A semiconductor device according to a ninth embodiment of the present inventive concepts will be described with reference to FIG. 11. For the sake of convenient explanation, the following description will focus on differences between the semiconductor device shown in FIG. 8 and the semiconductor device shown in FIG. 11.

Figure 11:
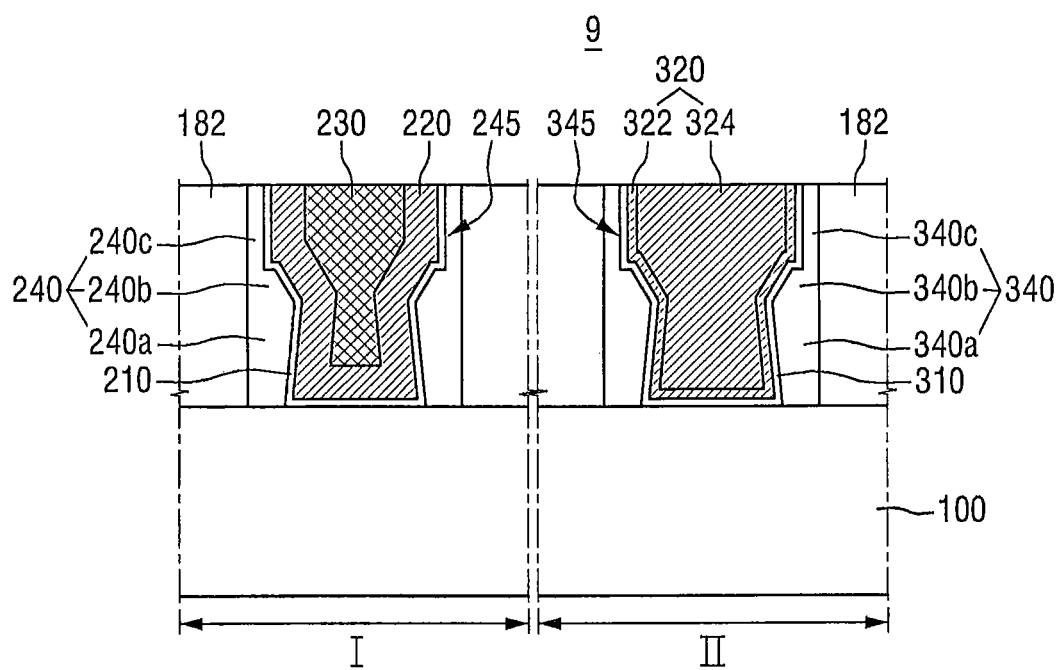
FIG. 11 illustrates a semiconductor device according to a ninth embodiment of the present inventive concepts.

FIG. 11 illustrates a semiconductor device according to a ninth embodiment of the present inventive concepts.

Referring to FIG. 11, in a first region I, second gate electrodes 220 and 230 include a second lower gate electrode 220 formed along at least portions of side surfaces and a bottom surface of a second trench 245, and a second upper gate electrode 230 filling at least a portion of the second trench 245 on the second lower gate electrode 220.

That is to say, the second upper gate electrode 230 as a filling gate electrode is formed in the first region I.

In a second region II, a third gate electrode 320 includes a first film 322 formed along at least portions of side surfaces and a bottom surface of a third trench 345, and a second film 324 filling at least a portion of the second trench 245 on the first film 322.

However, the third gate electrode 320 disposed on the second region II does not include the second upper gate electrode 230, that is, the filling gate electrode, included in the second gate electrodes 220 and 230 of the first region I.

A semiconductor device according to a tenth embodiment of the present inventive concepts will be described with reference to FIGS. 12 and 13. For the sake of convenient explanation, descriptions of overlapping content from the first embodiment shown in FIG. 1A will be briefly made or omitted.

Figure 12:
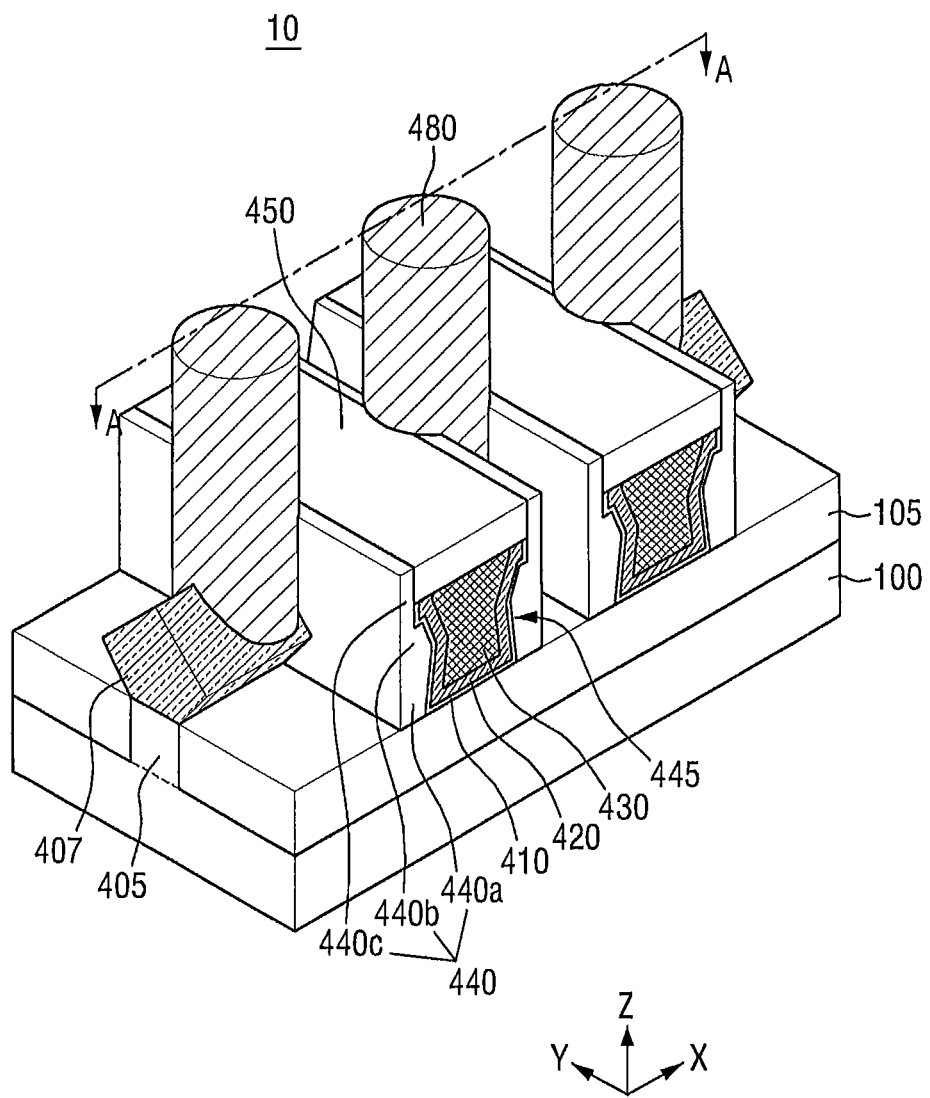
FIG. 12 is a perspective view illustrating a semiconductor device according to a tenth embodiment of the present inventive concepts.
Figure 13:
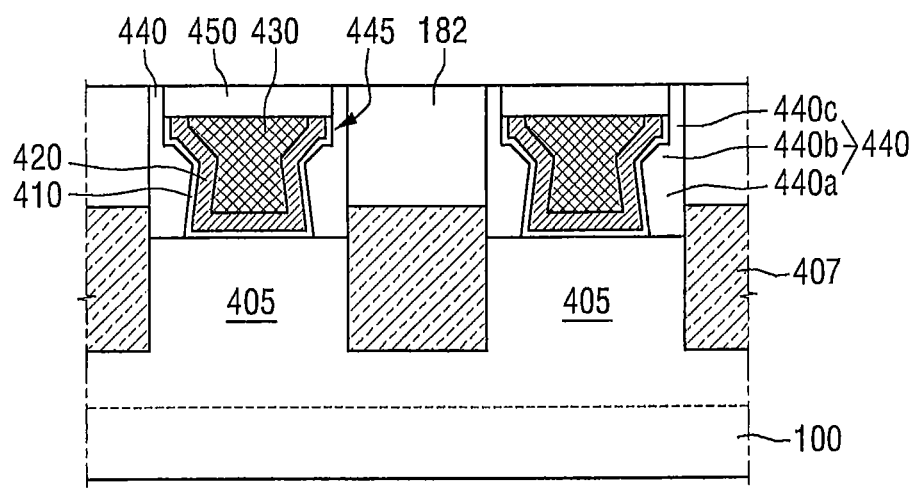
FIG. 13 is a cross-sectional view taken along the line A-A of FIG. 12.

FIG. 12 is a perspective view illustrating a semiconductor device according to a tenth embodiment of the present inventive concepts and FIG. 13 is a cross-sectional view taken along the line A-A of FIG. 12. For brevity, a first interlayer insulation film 182 is not illustrated in FIG. 12, and a second contact 480 is not illustrated in FIG. 13.

Referring to FIGS. 12 and 13, the semiconductor device 10 according to the tenth embodiment of the present inventive concepts includes a substrate 100, a fin type active pattern 405, a fourth gate spacer 440, a fourth trench 445, a fourth lower gate electrode 420, a fourth upper gate electrode 430, a fourth capping pattern 450 and a second contact 480.

The fin type active pattern 405 may protrude from the substrate 100. Since a field insulation film 105 covers portions of side surfaces of the fin type active pattern 405, the fin type active pattern 405 may protrude on the field insulation film 105 formed on the substrate 100.

The fin type active pattern 405 may extend lengthwise in a first direction X. The fin type active pattern 405 may be part of the substrate 100 and may include an epitaxial layer grown from the substrate 100.

The fin type active pattern 405 may include, for example, a single element semiconductor, such as silicon and/or germanium. Alternatively, the fin type active pattern 405 may include a compound semiconductor, for example, a group IV-IV compound semiconductor and/or a group III-V compound semiconductor. In detail, the group IV-IV compound semiconductor may be, for example, a binary compound or a ternary compound including at least two elements of carbon (C), silicon (Si), germanium (Ge), and tin (Sn) or a compound doped with a IV group element. The group III-V compound semiconductor may include, for example, a binary compound, a ternary compound or a quaternary compound, prepared by combining at least one group III element of aluminum (Al), gallium (Ga) and indium (In) with at least one group V element of phosphorus (P), arsenic (As) and antimony (Sb).

In the semiconductor device according to the tenth embodiment of the present inventive concepts, it is assumed that the fin type active pattern 405 includes silicon.

The fourth gate spacer 440 is formed on the fin type active pattern 405 protruding on the field insulation film 105. The fourth gate spacer 440 may extend lengthwise in a second direction Y and may cross the fin type active pattern 405.

The fourth gate spacer 440 may include a first part 440a, a second part 440b and a third part 440c sequentially positioned on the field insulation film 105.

An inner surface of the first part 440a of the fourth gate spacer 440 has a slope of an acute angle. However, an inner surface of the second part 440b of the fourth gate spacer 440 has a slope of an obtuse angle or a right angle. In FIGS. 12 and 13, the inner surface of the second part 440b of the fourth gate spacer 440 having a slope of an obtuse angle is exemplified, but aspects of the present inventive concepts are not limited thereto.

The inner surface of the first part 440a of the fourth gate spacer 440 and the inner surface of the second part 440b of the fourth gate spacer 440 have a continuous profile. However, the inner surface of the second part 440b of the fourth gate spacer 440 and the inner surface of a third part 440c of the fourth gate spacer 440 have a discontinuous profile. The profile of the inner surface of the fourth gate spacer 440 has a continuous part and a discontinuous part.

A height of the first part 440a of the fourth gate spacer 440 is greater than a height ranging from a top surface of the field insulation film 105 to a top surface of the fin type active pattern 405. That is to say, the height of the first part 440a of the fourth gate spacer 440 is greater than a height of the fin type active pattern 405 protruding on the field insulation film 105.

A height of the first part 440a of the fourth gate spacer 440 positioned on the fin type active pattern 405 is greater than a height of the first part 440a of the fourth gate spacer 440 positioned on the field insulation film 105. For example, a difference between the height of the first part 440a of the fourth gate spacer 440 positioned on the fin type active pattern 405 and the height of the first part 440a of the fourth gate spacer 440 positioned on the field insulation film 105 is substantially equal to the height of the fin type active pattern 405 protruding on the field insulation film 405.

Since the fourth trench 445 is defined by the fourth gate spacer 440, it may extend lengthwise in a second direction Y.

The fourth gate insulation film 410 is formed along at least portions of side surfaces and a bottom surface of the fourth trench 445. The fourth gate insulation film 410 formed along the bottom surface of the fourth trench 445 may be formed along profiles of the field insulation film 105 and the fin type active pattern 405.

The fourth lower gate electrode 420 is formed on the fourth gate insulation film 410. The fourth lower gate electrode 420 is formed along the fourth gate insulation film 410. The fourth lower gate electrode 420 formed on the side surfaces of the fourth trench 445 may overlap with a portion of the third part 440c of the fourth gate spacer 440.

The fourth lower gate electrode 420 may include an n type work function control film, or may include a stack of a p type work function control film and an n type work function control film.

The fourth upper gate electrode 430 is formed on the fourth lower gate electrode 420. The fourth upper gate electrode 430 fills at least a portion of the fourth trench 445. A top surface of the fourth upper gate electrode 430 and an uppermost surface of the fourth lower gate electrode 420 may be coplanar with each other.

The fourth gate electrodes 420 and 430 include a fourth lower gate electrode 420 and a fourth upper gate electrode 430. Top surfaces of the fourth gate electrodes 420 and 430 are recessed from a top surface of the first interlayer insulation film 182. That is to say, the fourth gate electrodes 420 and 430 fill at least portions of the fourth trench 445. The fourth gate electrodes 420 and 430 may be replacement metal gate electrodes.

The fourth capping pattern 450 is formed on the fourth upper gate electrode 430 and the fourth lower gate electrode 420. In the semiconductor device according to the ninth embodiment of the present inventive concepts, the fourth gate electrodes 420 and 430 fill portions of the fourth trench 445. Therefore, the fourth capping pattern 450 is formed by filling the portions of the fourth trench 445. The top surface of the fourth capping pattern 450 may be coplanar with the top surface of the fourth gate spacer 440.

An elevated source/drain 407 may be formed on at both sides of the fourth upper gate electrode 430 on the fin type active pattern 405. That is to say, the elevated source/drain 407 may be formed on side surfaces of the fourth gate spacer 440.

The elevated source/drain 407 may have various shapes. For example, the elevated source/drain 407 may have a shape of a diamond, a circle and/or a rectangle. In FIG. 12, the elevated source/drain 407 shaped of a diamond (or a pentagon or a hexagon) is exemplified.

When the semiconductor device 10 is a PMOS fin type transistor, the elevated source/drain 407 may include a compressive stress material. For example, when the fin type active pattern 405 includes silicon, the compressive stress material may be a material having a greater lattice constant than silicon (Si), e.g., SiGe. The compressive stress material may improve mobility of carriers of a channel region by applying compressive stress to the fin type active pattern 405.

However, when the semiconductor device 10 is an NMOS fin type transistor, the elevated source/drain 407 may include the same material with the fin type active pattern 405 or a tensile stress material. For example, when the fin type active pattern 405 includes silicon (Si), the elevated source/drain 407 may include silicon or a material having a smaller lattice constant than silicon, e.g., SiC.

The second contact 480 may be formed to be adjacent to the fourth gate spacer 440. The second contact 480 may be electrically connected to the elevated source/drain 407. The second contact 480 may be, for example, a self-aligned contact, but not limited thereto.

A semiconductor device according to an eleventh embodiment of the present inventive concepts will be described with reference to FIGS. 14 and 15. For the sake of convenient explanation, the following description will focus on differences between the semiconductor device shown in FIGS. 12 and 13 and the semiconductor device shown in FIGS. 14 and 15.

Figure 14:
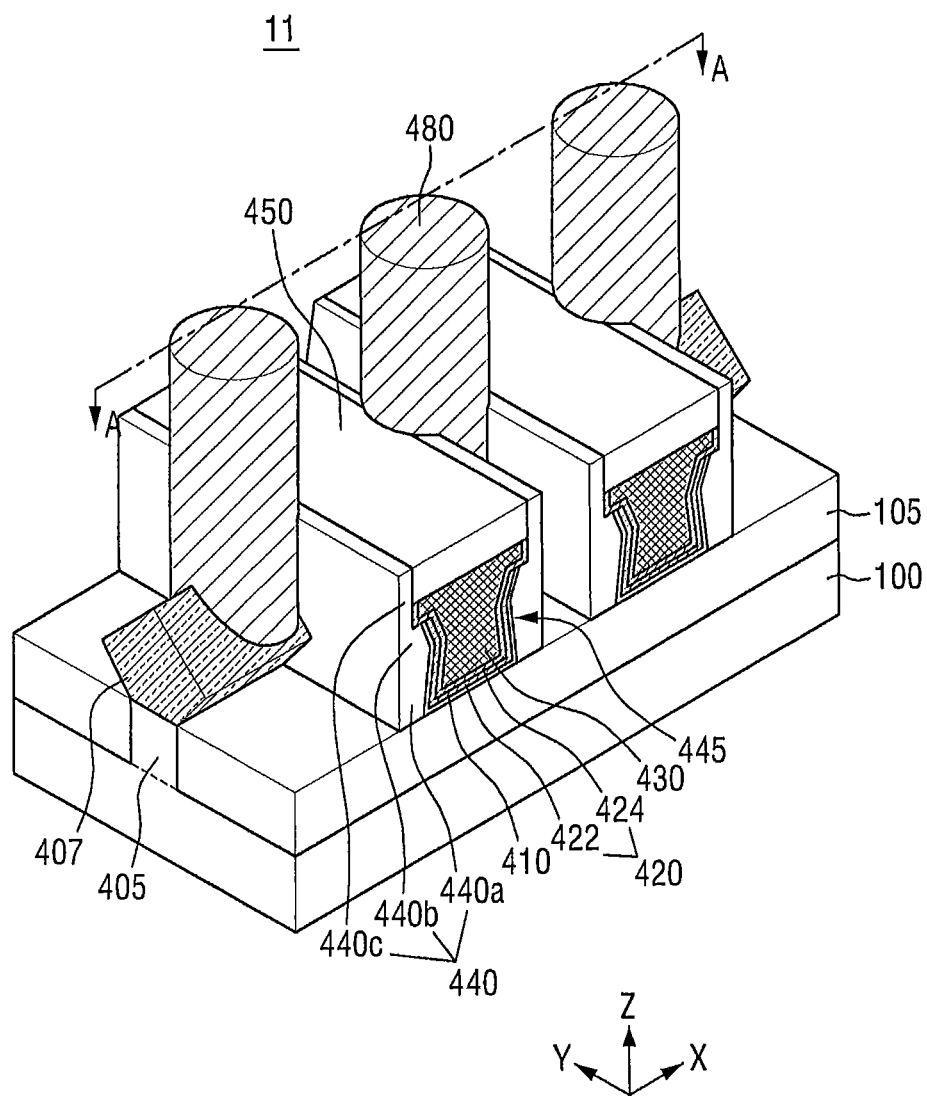
FIG. 14 is a perspective view illustrating a semiconductor device according to an eleventh embodiment of the present inventive concepts.
Figure 15:
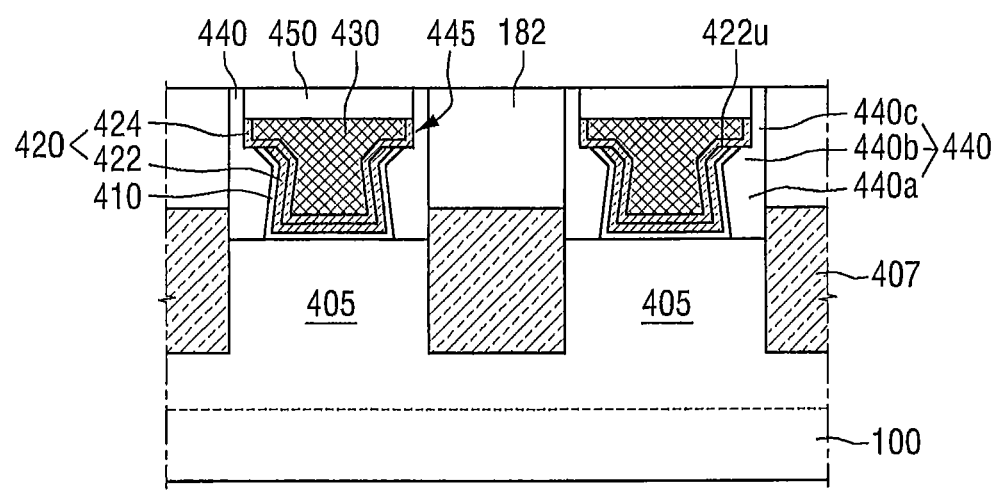
FIG. 15 is a cross-sectional view taken along the line A-A of FIG. 14.

FIG. 14 is a perspective view illustrating a semiconductor device according to an eleventh embodiment of the present inventive concepts and FIG. 15 is a cross-sectional view taken along the line A-A of FIG. 14.

Referring to FIGS. 14 and 15, the fourth lower gate electrode 420 may include a first film 422 and a second film 424 sequentially formed on a fourth gate insulation film 410.

The first film 422 of the fourth lower gate electrode 420 is formed along the fourth gate insulation film 410. The first film 422 of the fourth lower gate electrode 420 formed on side surfaces of the fourth trench 445 does not contact the fourth capping pattern 450 but is spaced apart from the fourth capping pattern 450 in a thickness direction of the substrate 100. In FIGS. 14 and 15, The first film 422 of the fourth lower gate electrode 420 formed on the side surfaces of the fourth trench 445 extend to a first part 440a of the fourth gate spacer 440 and a second part 440b of the fourth gate spacer 440, but aspects of the present inventive concepts are not limited thereto. The first film 422 of the fourth lower gate electrode 420 formed on the fourth trench 445 may overlap with a portion of the third part 440c of the fourth gate spacer 440.

The second film 424 of the fourth lower gate electrode 420 may be formed along the first film 422 of the fourth lower gate electrode 420 and the third part 440c of the fourth gate spacer 440. The second film 424 of the fourth lower gate electrode 420 may cover an uppermost surface 422u of the first film 422 of the fourth lower gate electrode 420.

In FIGS. 14 and 15, the fourth gate insulation film 410 formed on side surfaces of the fourth trench 445 extends from the first part 440a of the fourth gate spacer 440 to the second part 440b of the fourth gate spacer 440 and is spaced apart from the fourth capping pattern 450 in the thickness direction of the substrate 100, but aspects of the present inventive concepts are not limited thereto.

A semiconductor device according to a twelfth embodiment of the present inventive concepts will be described with reference to FIGS. 16 and 17. For the sake of convenient explanation, the following description will focus on differences between the semiconductor device shown in FIGS. 12 and 13 and the semiconductor device shown in FIGS. 14 and 15.

Figure 16:
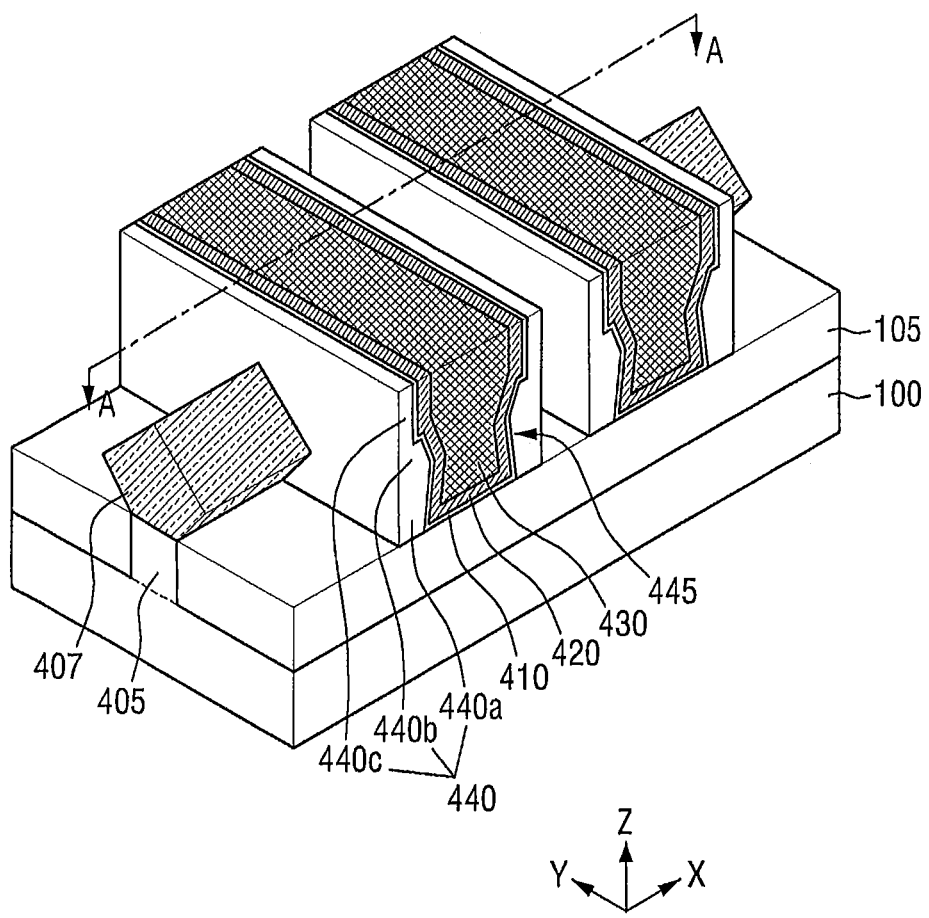
FIG. 16 is a perspective view illustrating a semiconductor device according to a twelfth embodiment of the present inventive concepts.
Figure 17:
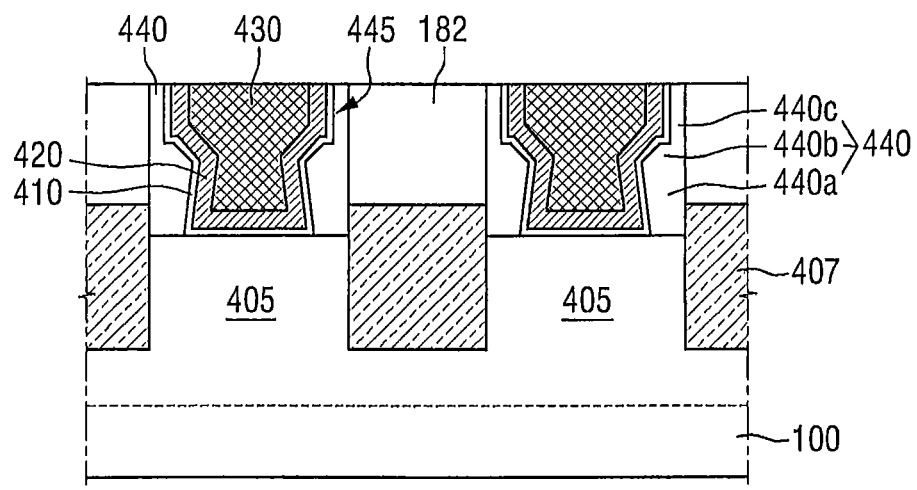
FIG. 17 is a cross-sectional view taken along the line A-A of FIG. 16.

FIG. 16 is a perspective view illustrating a semiconductor device according to a twelfth embodiment of the present inventive concepts and FIG. 17 is a cross-sectional view taken along the line A-A of FIG. 16.

Referring to FIGS. 16 and 17, the semiconductor device 12 according to the twelfth embodiment of the present inventive concepts does not include a fourth capping pattern (450 of FIG. 12). A top surface of a fourth upper gate electrode 430 and an uppermost surface of a fourth lower gate electrode 420 is coplanar with a top surface of a first interlayer insulation film 182. That is to say, top surfaces of the fourth gate electrodes 420 and 430 are not recessed from the top surface of the first interlayer insulation film 182.

The fourth lower gate electrode 420 is formed along the side surfaces and bottom surface of the fourth trench 445. The fourth lower gate electrode 420 formed along the side surfaces of the fourth trench 445 extends from the first part 440a of the fourth gate spacer 440 to the third part 440c of the fourth gate spacer 440. That is to say, the fourth lower gate electrode 420 may entirely overlap with the fourth gate spacer 440 on an inner surface of the fourth gate spacer 440.

Unlike in FIG. 12, in the semiconductor device according to the twelfth embodiment of the present inventive concepts, the fourth gate electrodes 420 and 430 and the fourth gate spacer 440 serving as a guide in forming a self aligned contact may not be formed, but aspects of the present inventive concepts are not limited thereto.

Moreover, FIGS. 12, 14 and 16 illustrate other embodiments of the present inventive concepts, wherein the fourth gate spacer 440 includes first and second opposing outer walls, and wherein the semiconductor device further comprises a first source/drain region 407 on the first outer wall remote from the fourth trench 445 and a second source/drain region 407 on the second outer wall remote from the fourth trench 445. These figures also illustrate an active semiconductor region 405 that extends from beneath the first source/drain region 407 to beneath the floor of the fourth trench 445 and to beneath the second source/drain region 407.

Next, an example electronic system using semiconductor devices according to some embodiments of the present inventive concepts shown in FIGS. 1A to 17 will be described.

Figure 18:
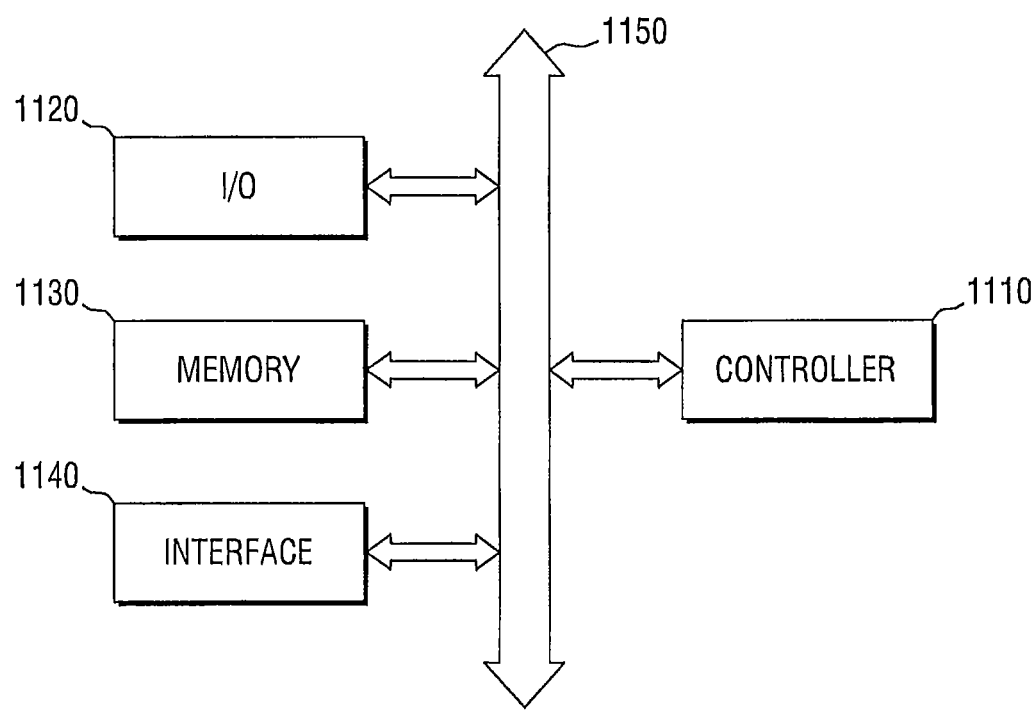
FIG. 18 is a block diagram of an electronic system including semiconductor devices according to some embodiments of the present inventive concepts.

FIG. 18 is a block diagram of an electronic system including semiconductor devices according to some embodiments of the present inventive concepts.

Referring to FIG. 18, the electronic system 1100 may include a controller 1110, an input/output device (I/O) 1120, a memory 1130, an interface 1140 and a bus 1150. The controller 1110, the I/O 1120, the memory 1130, and/or the interface 1140 may be connected to each other through the bus 1150. The bus 1150 corresponds to a path through which data moves.

The controller 1110 may include a microprocessor, a digital signal processor, a microcontroller and/or logic elements capable of functions similar to those of these elements. The I/O 1120 may include a keypad, a keyboard and/or a display device. The memory 1130 may store data and/or commands. The interface 1140 may perform functions of transmitting data to a communication network and/or receiving data from the communication network. The interface 1140 may be wired and/or wireless. For example, the interface 1140 may include an antenna and/or a wired/wireless transceiver, and so on. Although not shown, the electronic system 1100 may further include high-speed DRAM and/or SRAM as the working memory for improving the operation of the controller 1110. In addition, one of the semiconductor devices according to some embodiments of the present inventive concepts may be provided in the memory 1130 or may be provided some components of the controller 1110, the I/O 1120, the memory 1130 and/or the interface 1140.

The electronic system 1100 may be applied to a personal digital assistant (PDA), a portable computer, a web tablet, a wireless phone, a mobile phone, a digital music player, a memory card and/or any type of electronic device capable of transmitting and/or receiving information in a wireless environment.

Figure 19:
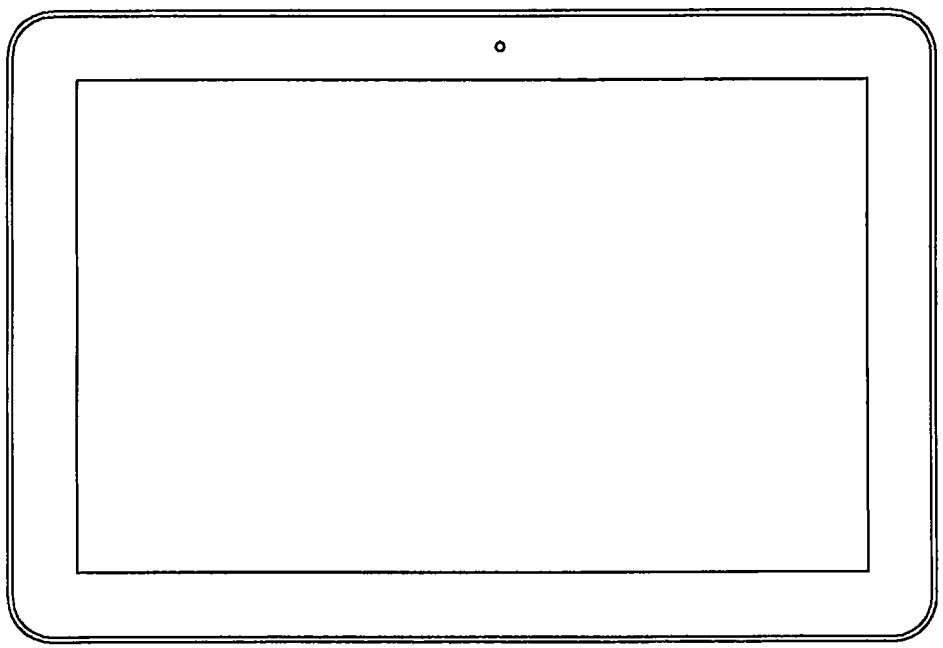
FIGS. 19 and 20 illustrate a semiconductor system to which semiconductor devices according to some embodiments of the present inventive concepts can be employed.
Figure 20:
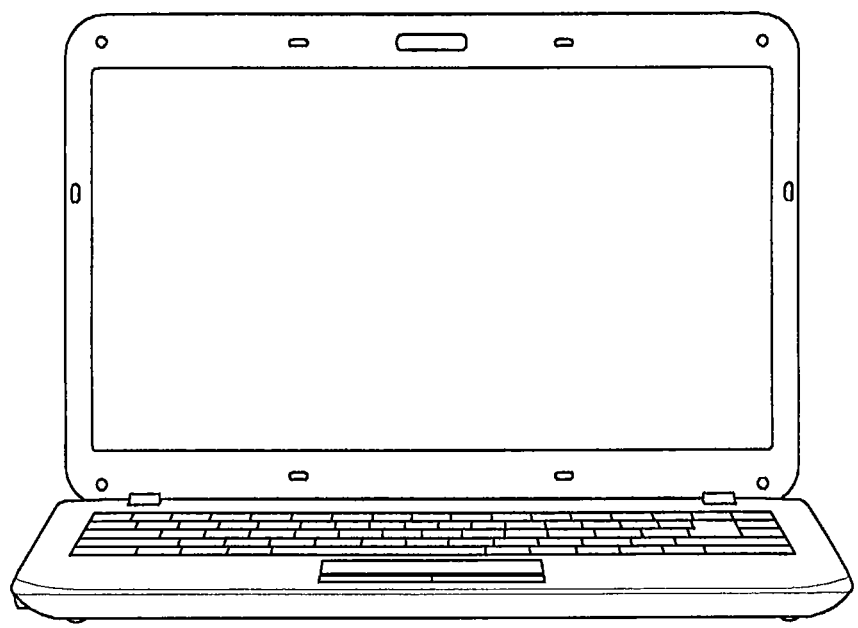

FIGS. 19 and 20 illustrate an exemplary semiconductor system to which semiconductor devices according to some embodiments of the present inventive concepts can be employed. FIG. 19 illustrates an example in which a semiconductor device according to an embodiment of the present inventive concepts is applied to a tablet PC, and FIG. 20 illustrates an example in which a semiconductor device according to an embodiment of the present inventive concepts is applied to a notebook computer. It will be understood that the semiconductor devices according to some embodiments of the present inventive concepts may also be applied to other IC devices not illustrated herein.

Hereinafter, a method for fabricating the semiconductor device according to the first embodiment of the present inventive concepts will be described with reference to FIGS. 21 to 29. The semiconductor device according to the fifth embodiment of the present inventive concepts may also be fabricated using the method shown in FIGS. 21 to 29.

FIGS. 21 to 29 illustrate intermediate process steps in a method for fabricating the semiconductor device according to the first embodiment of the present inventive concepts.

Figure 21:
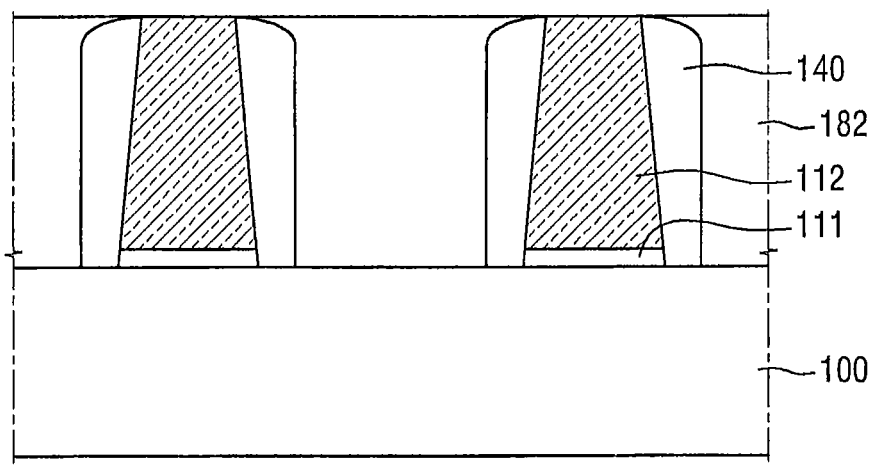
FIGS. 21 to 29 illustrate intermediate process steps in a method for fabricating the semiconductor device according to the first embodiment of the present inventive concepts.

Referring to FIG. 21, a dummy gate insulation film 111 and a dummy gate electrode 112 are formed on the substrate 100. The dummy gate insulation film 111 and the dummy gate electrode 112 may be sequentially stacked on the substrate 100.

The dummy gate insulation film 111 may include silicon oxide and/or silicon oxynitride. The dummy gate electrode 112 may include, for example, silicon. In detail, the dummy gate electrode 112 may include polycrystalline silicon (poly Si) and/or amorphous silicon (a-Si). The first dummy gate electrode 117 may be undoped or doped with impurity.

Next, a first gate spacer 140 is formed on side surfaces of a stacked structure of the dummy gate insulation film 111 and the dummy gate electrode 112. The first gate spacer 140 may include an upper spacer (140y of FIG. 25) and a lower spacer (140x of FIG. 25).

After the first gate spacer 140 is formed, source/drain regions are formed at both sides of the dummy gate electrode 112.

Next, a first interlayer insulation film 182 covering the dummy gate electrode 112 and the first gate spacer 140 is formed on the substrate 100. The first interlayer insulation film 182 may include, for example, a low-k dielectric layer, an oxide layer and/or an oxynitride layer.

Next, the first interlayer insulation film 182 is planarized, thereby exposing a top surface of the dummy gate electrode 112 and the first gate spacer 140. For example, in the planarizing, a chemical mechanical polishing (CMP) process may be used. As the result, the first interlayer insulation film 182 surrounding the first gate spacer 140 and the dummy gate electrode 112 is formed.

Figure 22:
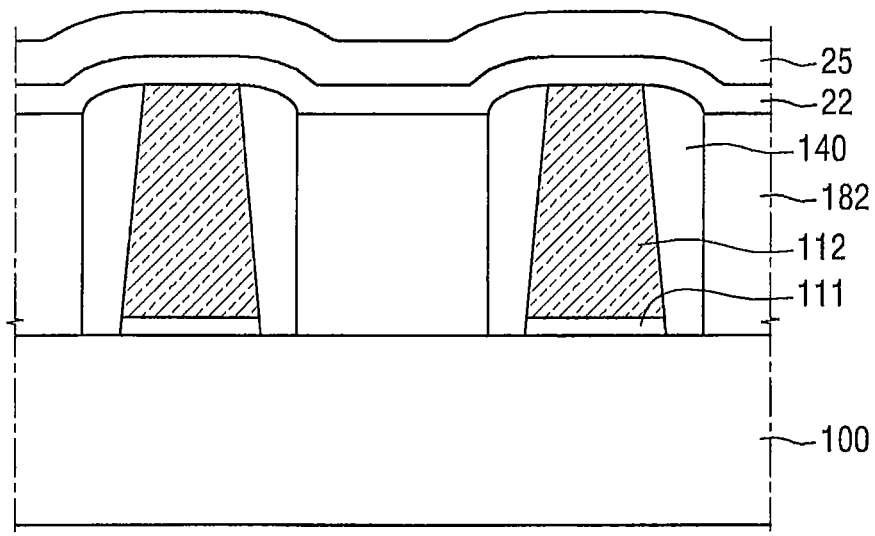

Referring to FIG. 22, a portion of the first interlayer insulation film 182 is recessed, thereby allowing the first gate spacer 140 and the dummy gate electrode 112 to protrude on a top surface of the first interlayer insulation film 182.

In order to recess a portion of the first interlayer insulation film 182, the first interlayer insulation film 182 includes a material having sufficient etching selectivity with respect to the first gate spacer 140 and the dummy gate electrode 112.

Next, a pre-etch stop film 22, covering the protruding first gate spacer 140 and the dummy gate electrode 112 and the top surface of the first interlayer insulation film 182, is conformally formed.

The pre-etch stop film 22 may include a material having etching selectivity with respect to the dummy gate electrode 112 and the first gate spacer 140. For example, the pre-etch stop film 22 may include carbon (C), nitrogen (N), oxygen (O), hydrogen (H) and/or silicon (Si).

The pre-etch stop film 22 may be a single layer including a material having the same composition ratio as a whole. Alternatively, the pre-etch stop film 22 may be a graded layer including a material having a composition ratio varying in the thickness direction of the substrate 100. When the pre-etch stop film 22 is a graded layer, a portion of the pre-etch stop film 22 adjacent to the first interlayer insulation film 182 may include a material having etching selectivity with respect to the first interlayer insulation film 182. A portion of the pre-etch stop film 22 spaced apart from the first interlayer insulation film 182, that is, a portion of the top surface of the pre-etch stop film 22, may including an etching resistant material.

Next, a mask film 25 is formed on the pre-etch stop film 22. The mask film 25 may include a material having etching selectivity with respect to the pre-etch stop film 22. For example, the mask film 25 may include carbon (C), nitrogen (N), oxygen (O), hydrogen (H) and fluorine (F) and/or silicon (Si), but that is different from the pre-etch stop film.

The mask film 25 may be formed by, for example, chemical vapor deposition (CVD), atomic layer deposition (ALD), thermal deposition, etc., but not limited thereto.

Figure 23:
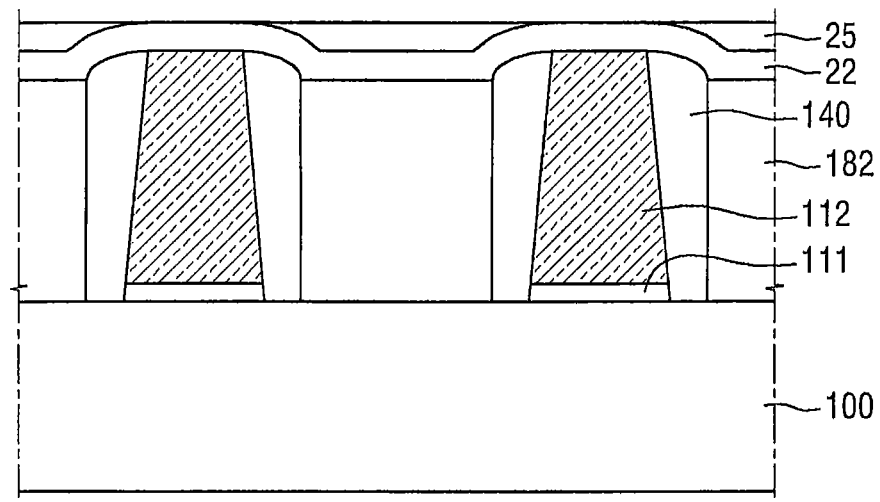

Referring to FIG. 23, the mask film 25 is planarized to expose the pre-etch stop film 22.

A portion of the pre-etch stop film 22 exposed by the mask film 25 overlaps with the first gate spacer 140 and the dummy gate electrode 112.

After the portion of the first interlayer insulation film 182 is recessed, the pre-etch stop film 22 and the mask film 25 are sequentially formed. Thereafter, when the mask film 25 is planarized to expose the pre-etch stop film 22, a process of forming an additional mask for exposing the portion of the pre-etch stop film 22 exposed by the mask film 25 overlapping with the first gate spacer 140 and the dummy gate electrode 112 may not be performed. That is to say, since the planarized mask film 25 serves a self mask, no additional mask is required.

Figure 24:
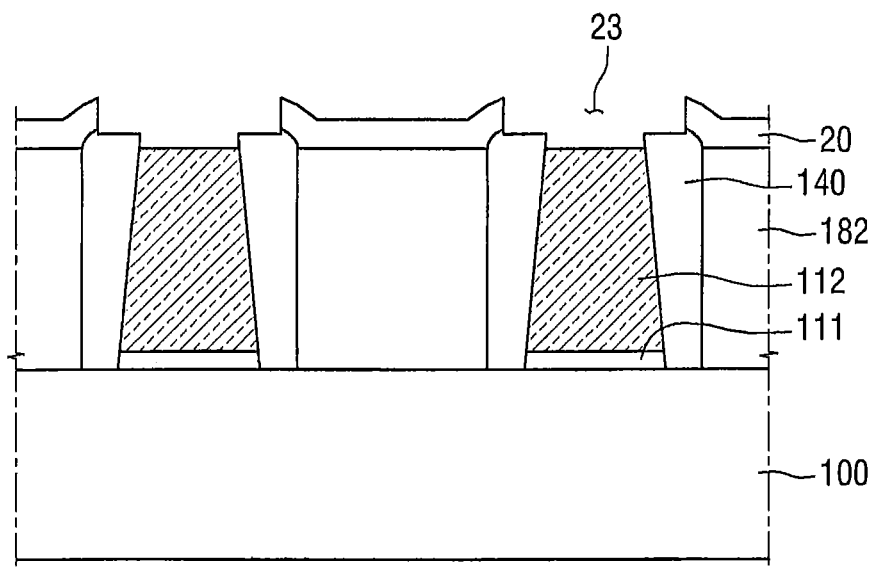

Referring to FIG. 24, an etch stop film 20 is formed on the first interlayer insulation film 182. The etch stop film 20 includes an opening 23 exposing the dummy gate electrode 112 and the first gate spacer 140.

In the forming of the etch stop film 20, the pre-etch stop film (22 of FIG. 23) overlapping with the first gate spacer 140 and the dummy gate electrode 112 is removed, thereby exposing the dummy gate electrode 112 and the first gate spacer 140.

The forming of the etch stop film 20 may be performed by, for example, etching.

In the illustrated embodiment, a portion of the first gate spacer 140 and a portion of the dummy gate electrode 112 are removed while forming the etch stop film 20, but aspects of the present inventive concepts are not limited thereto. In addition, in the illustrated embodiment, the mask film 25 formed on the etch stop film 20 is entirely removed while forming the etch stop film 20, which is, however, provided only for the sake of convenient explanation, but aspects of the present inventive concepts are not limited thereto.

Figure 25:
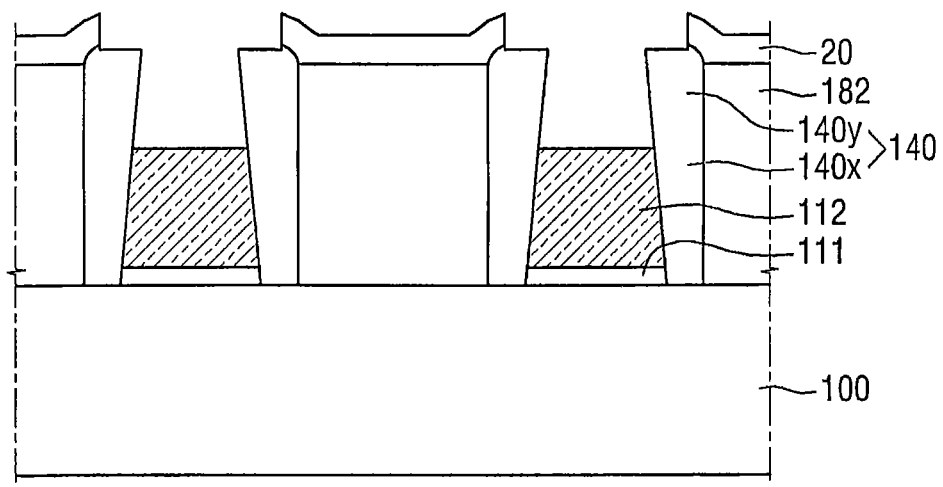

Referring to FIG. 25, a portion of the dummy gate electrode 112 is exposed by the etch stop film 20, thereby exposing an inner surface of a top portion 140y of the first gate spacer 140. In detail, the dummy gate electrode 112 overlapping with the top portion 140y of the first gate spacer 140 is etched on the inner surface of the first gate spacer 140, thereby exposing the inner surface of the top portion 140y of the first gate spacer 140.

Therefore, on the inner surface of the first gate spacer 140, the dummy gate electrode 112 overlaps with a bottom portion 140x of the first gate spacer 140 while not overlapping with the top portion 140y of the first gate spacer 140.

The removing of the portion of the dummy gate electrode 112 may be performed by, for example, dry etching, but aspects of the present inventive concepts are not limited thereto.

Figure 26:
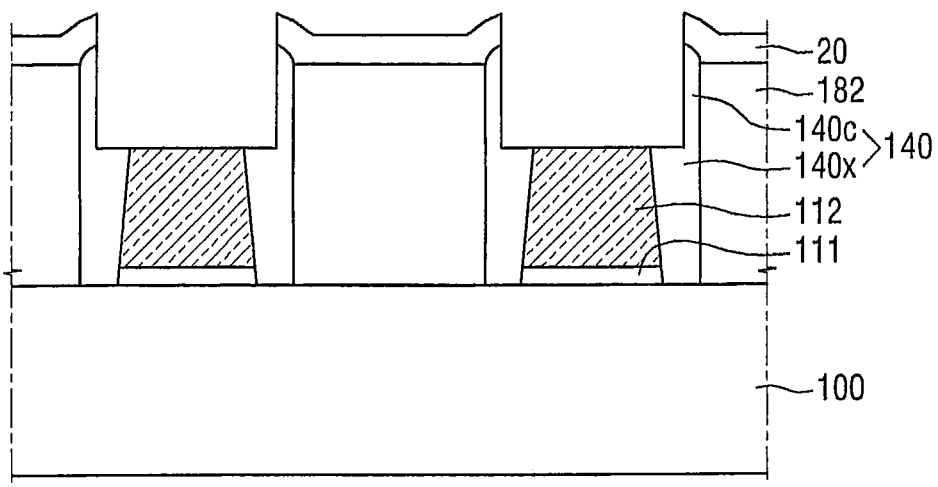

Referring to FIG. 26, a portion of the top portion 140y of the first gate spacer 140 is removed using the etch stop film 20 as an etch mask. A thickness of the top portion 140y of the first gate spacer 140 is reduced by etching the portion of the top portion 140y of the first gate spacer 140.

As the thickness of the top portion 140y of the first gate spacer 140 is reduced, a third part 140c of the first gate spacer 140 is formed. As the result, the inner surface of the first gate spacer 140 may be shaped like a staircase and the first gate spacer 140 may be shaped like a bench.

Figure 27:
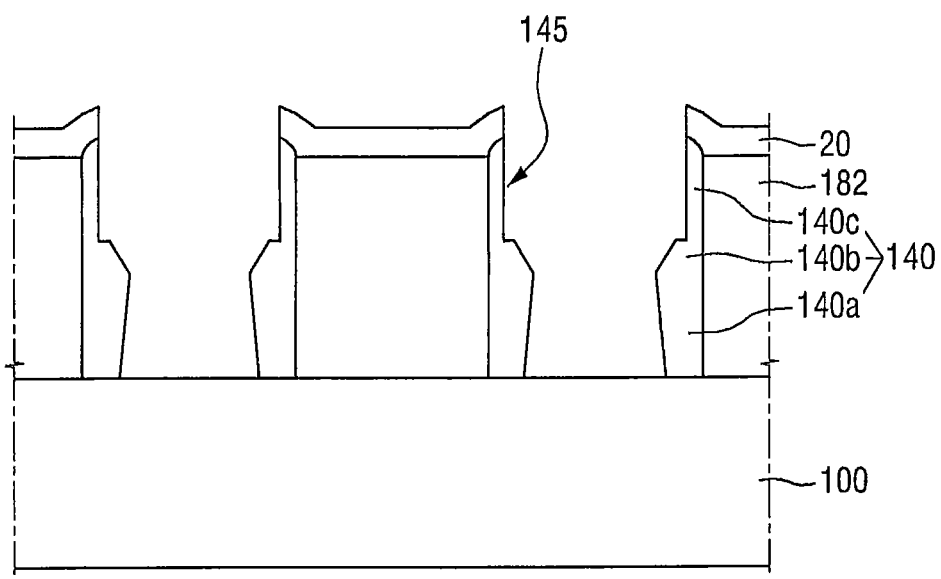

Referring to FIG. 27, the dummy gate electrode 112 overlapping with the bottom portion 140x of the first gate spacer 140 and the and the dummy gate insulation film 111 are removed using the etch stop film 20 as an etch mask.

As the result, a first trench 145 exposing the top surface of the substrate 100 is formed.

In the forming of the first trench 145, a portion of the bottom portion 140x of the first gate spacer 140 is etched, thereby forming the second part 140b of the first gate spacer 140. In addition, the remaining portion of the bottom portion 140x of the first gate spacer 140 corresponds to the first part 140a of the first gate spacer 140.

Figure 28:
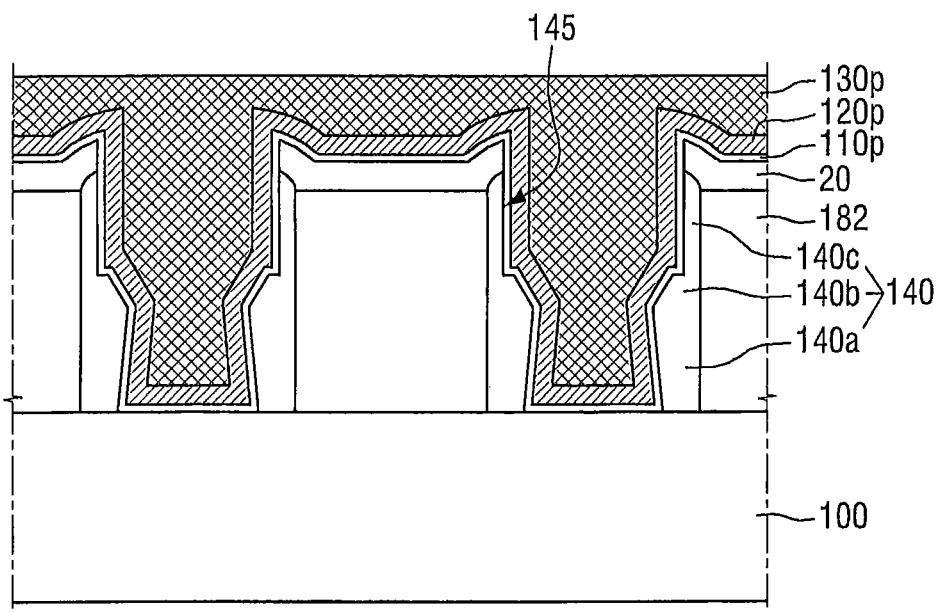

Referring to FIG. 28, an insulation film 110p and a lower electrode film 120p are sequentially formed along the top surface of the first interlayer insulation film 182 and the side surfaces and bottom surface of the first trench 145. An upper electrode film 130p filling the first trench 145 and covering the first interlayer insulation film 182 is formed on the top surface of the lower electrode film 120p.

The insulation film 110p may include, for example, a high-k material, but not limited thereto. The lower electrode film 120p may include, for example, an n type work function control film, or a stack of a p type work function control film and an n type work function control film, but not limited thereto.

The upper electrode film 130p may include, for example, tungsten (W) and/or aluminum (Al), but not limited thereto.

Figure 29:
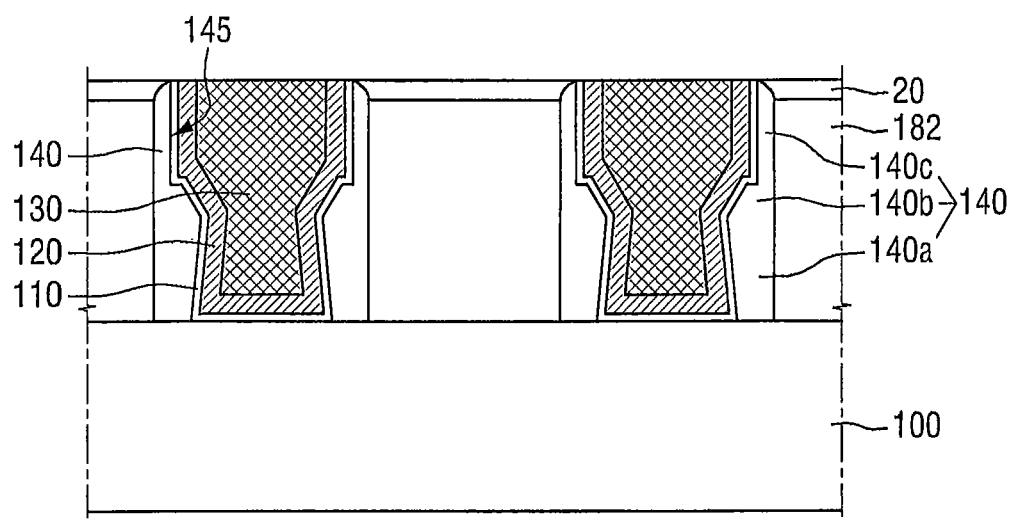

Referring to FIG. 29, the insulation film 110p, the lower electrode film 120p and the upper electrode film 130p are planarized, thereby exposing the etch stop film 20.

As the result, the first gate insulation film 110p, the first lower gate electrode 120 and the first upper gate electrode 130 are formed in the first trench 145.

Next, the etch stop film 20 is removed by planarizing, thereby exposing the top surface of the first interlayer insulation film 182.

A method for fabricating the semiconductor device according to the second embodiment of the present inventive concepts will now be described with reference to FIGS. 21 to 31. The semiconductor device 1 according to the first embodiment of the present inventive concepts may also be fabricated using the fabricating method according to the second embodiment of the present inventive concepts.

Figure 30:
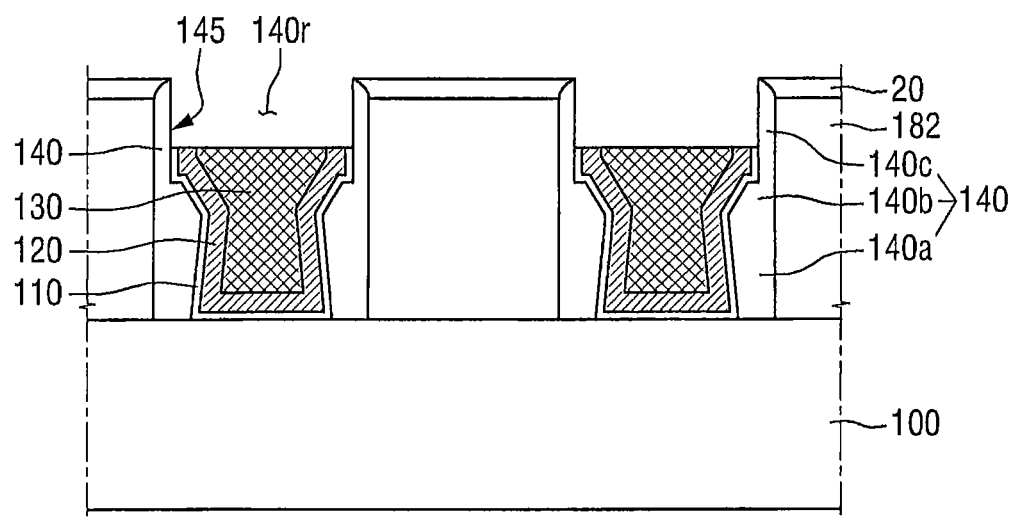
FIGS. 30 and 31 illustrate intermediate process steps in a method for fabricating the semiconductor device according to the second embodiment of the present inventive concepts.
Figure 31:
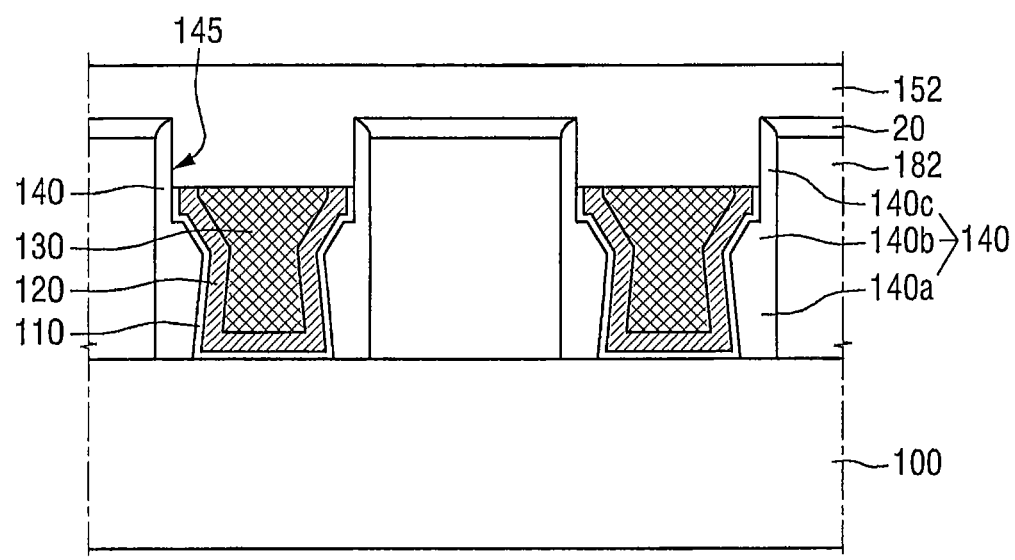

FIGS. 30 and 31 illustrate intermediate process steps in a method for fabricating the semiconductor device according to the second embodiment of the present inventive concepts.

Referring to FIG. 30, portions of the first gate insulation film 110p, the first lower gate electrode 120 and the first upper gate electrode 130 are removed, thereby forming the recess 140r.

A bottom surface of the recess 140r corresponds to the first gate insulation film 110p, the first lower gate electrode 120 and the first upper gate electrode 130, and the side surfaces of the recess 140r correspond to the first gate spacer 140.

Referring to FIG. 31, a capping film 152 filling the recess 140r and covering the top surface of the etch stop film 20 is formed.

The capping film 152 may include, for example, silicon nitride (SiN), silicon oxynitride (SiON), silicon oxide (SiO2), silicon carbonitride (SiCN) and/or silicon oxycarbonitride (SiOCN).

Next, the capping film 152 formed on the top surface of the first interlayer insulation film 182 and the etch stop film 20 are removed, thereby exposing the top surface of the first interlayer insulation film 182. The capping film 152 and the etch stop film 20 may be removed by planarizing.

As the result, the first capping pattern 150 filling a portion of the first trench 145 is formed.

A method for fabricating the semiconductor device according to the third embodiment of the present inventive concepts will now be described with reference to FIGS. 21, 23 to 28 and 30 to 33. The semiconductor device according to the first embodiment of the present inventive concepts may also be fabricated using the fabricating method according to the third embodiment of the present inventive concepts. For the sake of convenient explanation, the following description will focus on differences between the present and previous embodiments of the present inventive concepts.

Figure 32:
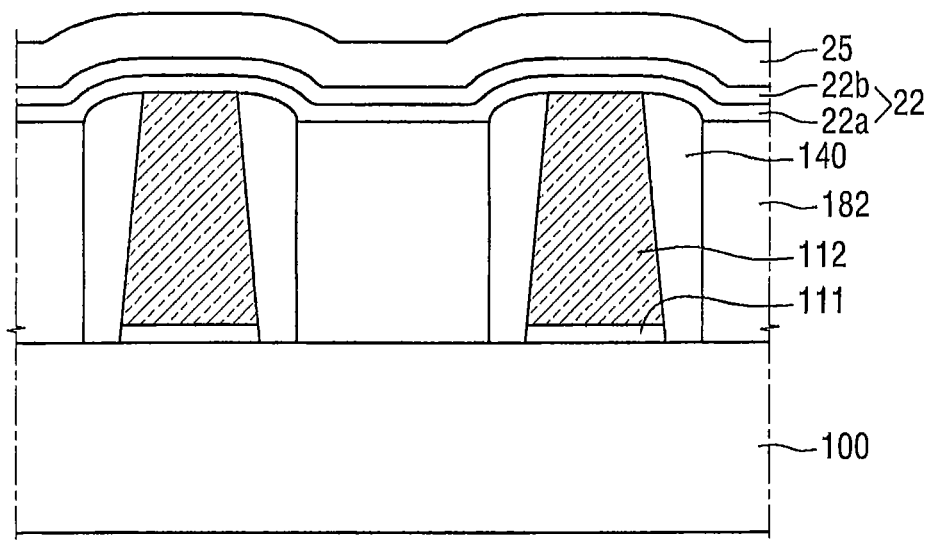
FIGS. 32 and 33 illustrate intermediate process steps in a method for fabricating the semiconductor device according to the third embodiment of the present inventive concepts.
Figure 33:
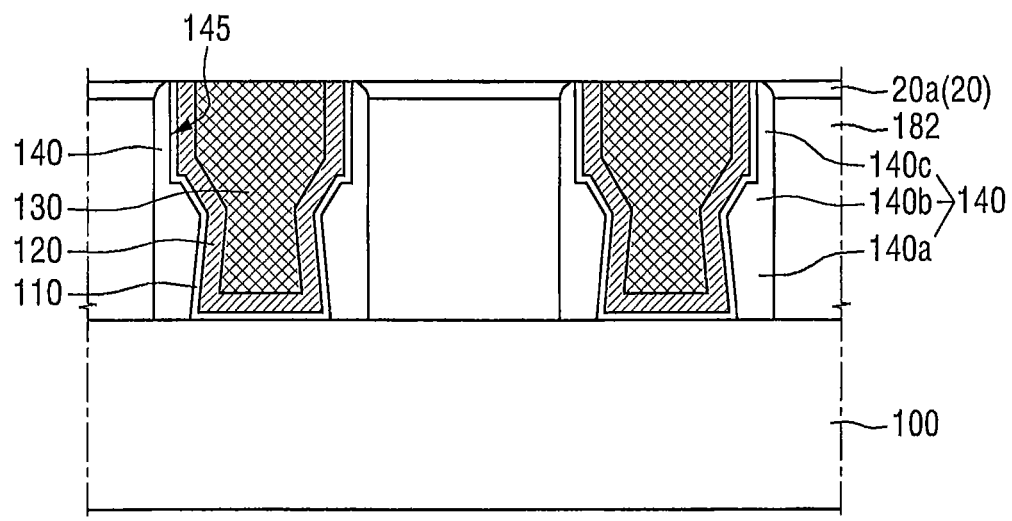

FIGS. 32 and 33 illustrate intermediate process steps in a method for fabricating the semiconductor device according to the third embodiment of the present inventive concepts.

Referring to FIG. 32, the portion of the first interlayer insulation film 182 is recessed, thereby allowing the first gate spacer 140 and the dummy gate electrode 112 to protrude on the top surface of the first interlayer insulation film 182.

Next, the pre-etch stop film 22 covering the first gate spacer 140, the dummy gate electrode 112 and the top surface of the first interlayer insulation film 182 is conformally formed.

The pre-etch stop film 22 includes a lower pre-etch stop film 22a and an upper pre-etch stop film 22b sequentially formed on the first interlayer insulation film 182.

The lower pre-etch stop film 22a may include a material having an etching selectivity with respect to the capping film 152 and the upper pre-etch stop film 22b. The upper pre-etch stop film 22b may include a material having an etching selectivity with respect to the dummy gate electrode 112 and the first gate spacer 140. The lower pre-etch stop film 22a may include, for example, a metal oxide film, a metal nitride film and/or a germanium film. The upper pre-etch stop film 22b may include carbon (C), nitrogen (N), oxygen (O) and hydrogen (H) and/or silicon (Si), that is different from the lower pre-etch stop film 22a.

Next, the processes described above with reference to FIGS. 23 and 28 are performed.

Referring to FIG. 33, the insulation film 110p, the lower electrode film 120p and the upper electrode film 130p are planarized, thereby exposing the lower etch stop film 20a.

Next, portions of the first gate insulation film 110p, the first lower gate electrode 120 and the first upper gate electrode 130 are removed, thereby forming the recess 140r.

Next, the capping film 152 filling the recess 140r and covering the top surface of the etch stop film 20 is formed.

Next, the capping film 152 formed on the top surface of the first interlayer insulation film 182 and the etch stop film 20a are removed, thereby exposing the top surface of the first interlayer insulation film 182.

A method for fabricating the semiconductor device according to the fourth embodiment of the present inventive concepts will now be described with reference to FIGS. 21 to 27, 30, 31 and 34 to 36. The semiconductor device according to the second embodiment of the present inventive concepts may also be fabricated using the fabricating method according to the fourth embodiment of the present inventive concepts.

Figure 34:
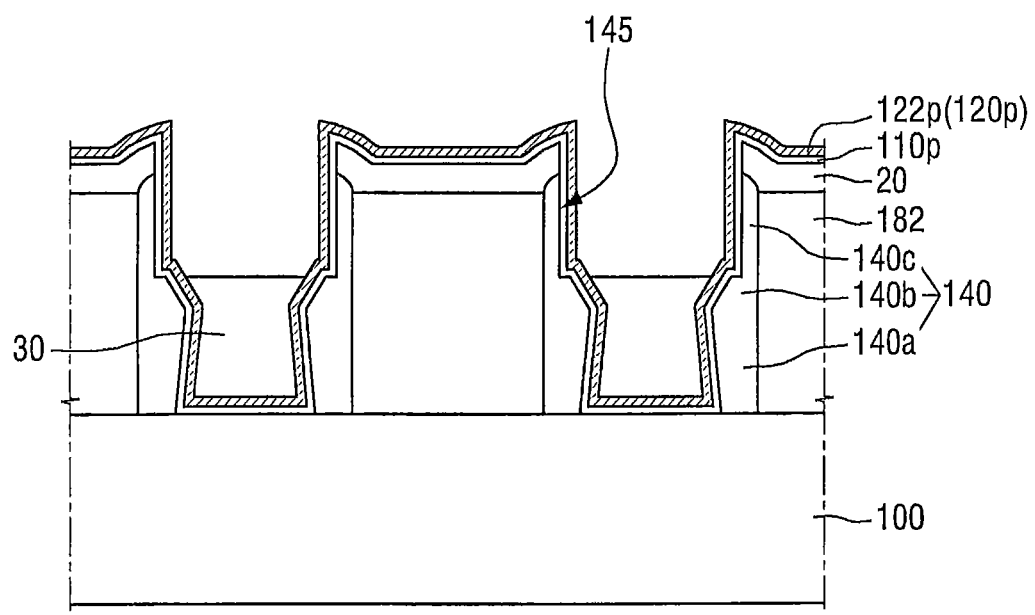
FIGS. 34 to 36 illustrate intermediate process steps in a method for fabricating the semiconductor device according to the fourth embodiment of the present inventive concepts.
Figure 35:
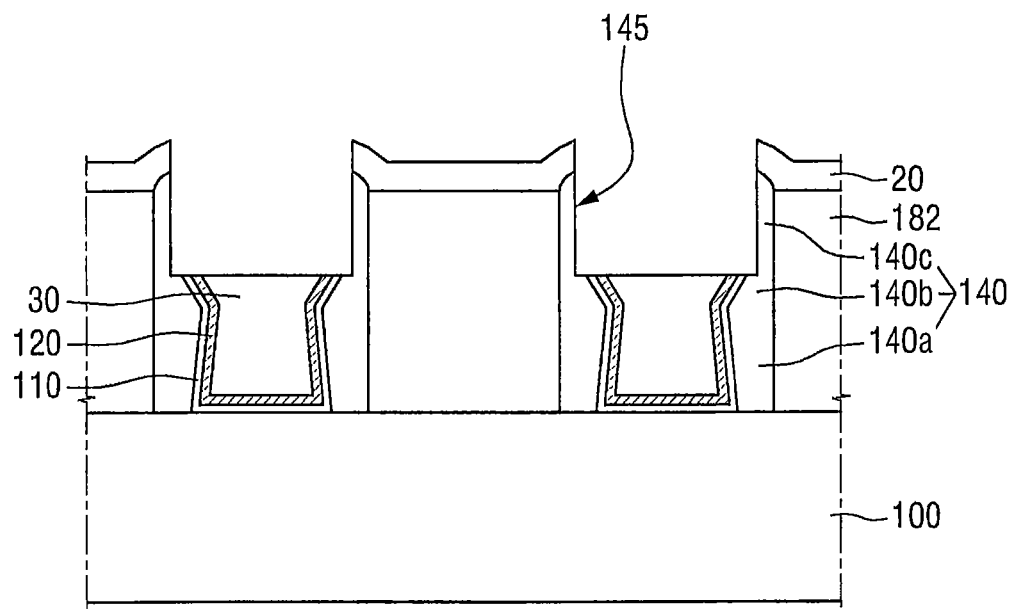
Figure 36:
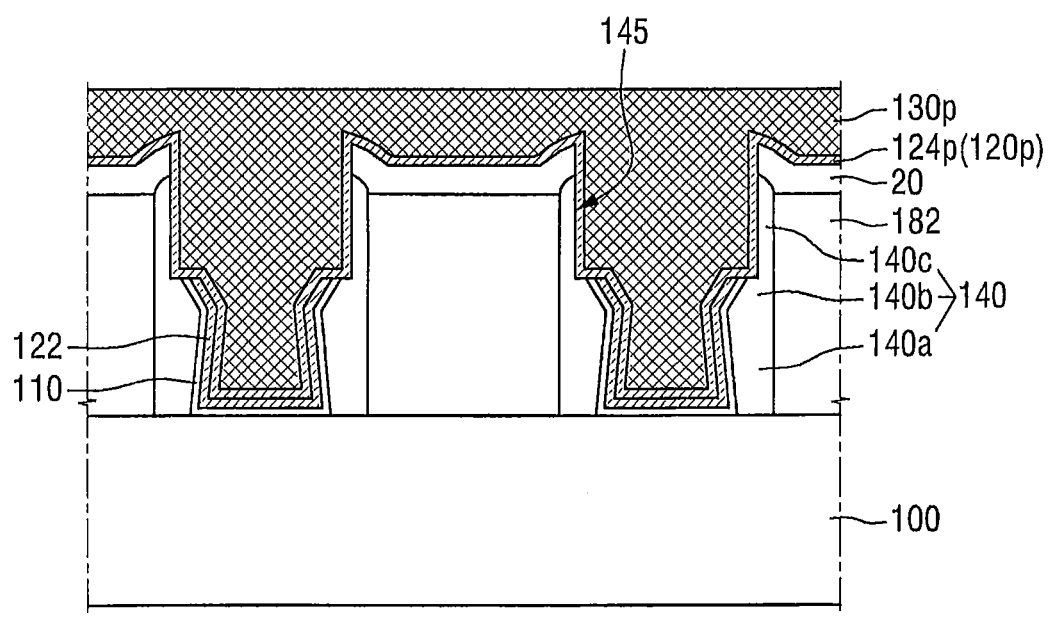

FIGS. 34 to 36 illustrate intermediate process steps in a method for fabricating the semiconductor device according to the fourth embodiment of the present inventive concepts.

Referring to FIG. 34, the insulation film 110p and the first film 122p of the lower electrode film 120p are sequentially formed along the top surface of the first interlayer insulation film 182 and the side surfaces and bottom surface of the first trench 145.

The first film 122p of the lower electrode film 120p may include, for example, a p type work function control film, but is not limited thereto.

Next, a pre-sacrificial film, filling the first trench 145 on the first film 122p of the lower electrode film 120p and covering the top surface of the first interlayer insulation film 182, is formed. The pre-sacrificial film may include a material having good gap-fill capability so as to efficiently fill the first trench 145. The pre-sacrificial film may include, for example, a spin on hardmask (SOH), but is not limited thereto.

Next, the pre-sacrificial film is etched back, thereby forming the sacrificial film 30 filling a portion of the first trench 145.

Referring to FIG. 35, the sacrificial film 30 is etched back using a mask, thereby removing the insulation film 110p formed on the top surface of the first interlayer insulation film 182 and the first film 122p of the lower electrode film 120p. In addition, the insulation film 110p formed on the side surfaces of the first trench 145 exposed by the sacrificial film 30 and the first film 122p of the lower electrode film 120p are removed.

As the result, the first gate insulation film 110p formed along portions of the side surfaces and bottom surface of the first trench 145 and the first film 122 of the first lower gate electrode 120 are formed.

Next, a sacrificial film 30 is removed.

Referring to FIG. 36, a second film 124p of the lower electrode film 120p is formed along the top surface of the first interlayer insulation film 182, portions of the side surfaces of the first trench 145 and the first film 122 of the first lower gate electrode 120.

The second film 124p of the lower electrode film 120p may include, for example, an n type work function control film, but is not limited thereto.

Next, an upper electrode film 130, filling the first trench 145 and covering the top surface of the first interlayer insulation film 182, is formed on the second film 124p of the lower electrode film 120p.

Next, the second film 124p of the lower electrode film 120p and the upper electrode film 130p are planarized by CMP, thereby exposing the etch stop film 20.

Next, portions of the second film 124 of the first lower gate electrode 120 and the first upper gate electrode 130 are removed, thereby forming the recess 140r.

Next, the capping film 152 filling the recess 140r and covering the top surface of the etch stop film 20 is formed.

Next, the capping film 152 formed on the top surface of the first interlayer insulation film 182 and the etch stop film 20 are removed, thereby exposing the top surface of the first interlayer insulation film 182.

A method for fabricating the semiconductor device according to the fifth embodiment of the present inventive concepts will now be described with reference to FIGS. 21, 37 and 38.

Figure 37:
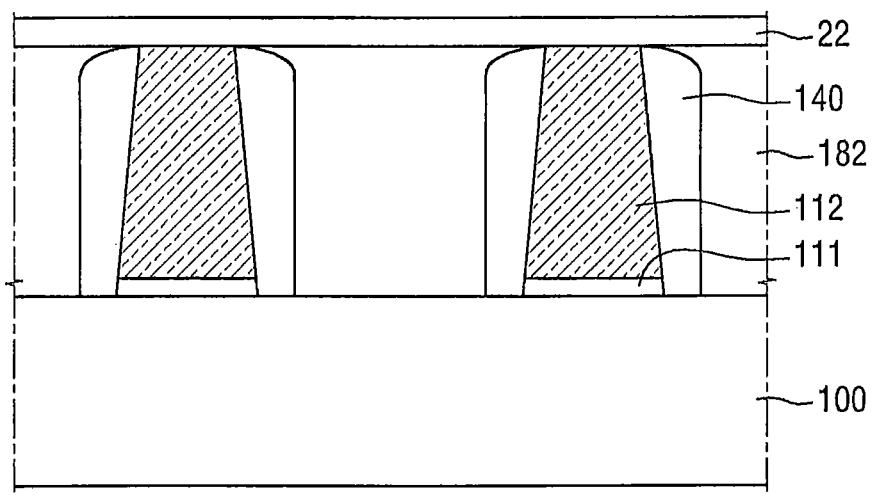
FIGS. 37 and 38 illustrate intermediate process steps in a method for fabricating the semiconductor device according to the fifth embodiment of the present inventive concepts.
Figure 38:
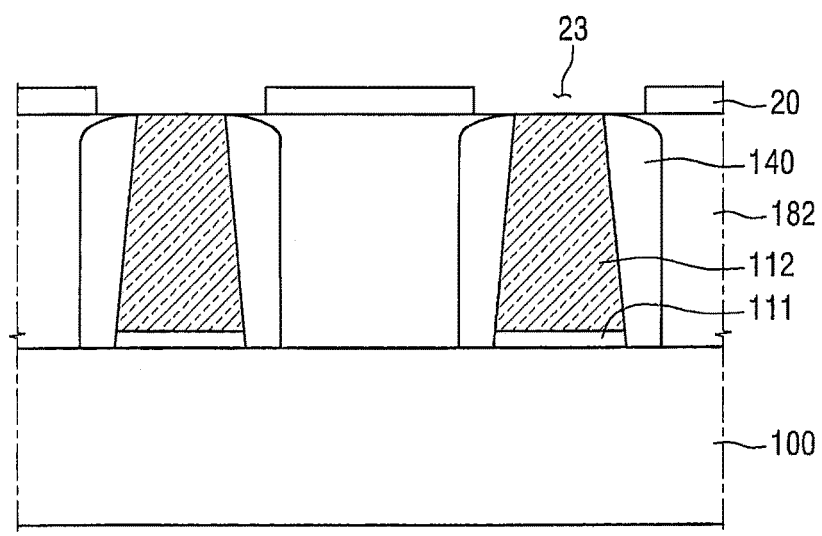

FIGS. 37 and 38 illustrate intermediate process steps in a method for fabricating the semiconductor device according to the fifth embodiment of the present inventive concepts.

Referring to FIG. 37, the pre-etch stop film 22, covering the top surface of the first interlayer insulation film 182, the first gate spacer 140 and the top surface of the dummy gate electrode 112, is formed.

Referring to FIG. 38, a photoresist pattern is formed on the pre-etch stop film 22, the photoresist pattern exposing a portion of the pre-etch stop film 22 overlapping with the first gate spacer 140 and the dummy gate electrode 112.

Next, the pre-etch stop film 22 is patterned using the photoresist pattern as a mask, thereby forming the etch stop film 20 exposing the first gate spacer 140 and the top surface of the dummy gate electrode 112.

While the present inventive concepts have been particularly shown and described with reference to various embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A method of fabricating a semiconductor device, the method comprising:
   forming a dummy silicon gate on a substrate and a gate spacer including an upper part and a lower part on a sidewall of the dummy silicon gate;
   forming an interlayer insulation film to surround the dummy silicon gate and the gate spacer and expose an upper surface of the dummy silicon gate;
   forming an etch stop film on the interlayer insulation film, the etch stop film including an opening exposing the dummy silicon gate and the gate spacer; and
   forming a trench to expose the substrate by removing the dummy silicon gate using the etch stop film as a mask,
   wherein the forming an etch stop film comprises:
      recessing a portion of the interlayer insulation film to protrude a portion of the gate spacer and a portion of the dummy silicon gate from an upper surface of the interlayer insulation film;
      forming a pre-etch stop film conformally on the protruding portions of the gate spacer and the dummy silicon gate and the upper surface of the interlayer insulation film;

forming a mask film on the pre-etch stop film, the mask film having etching selectivity with respect to the pre-etch stop film;

planarizing the mask film to expose a portion of the pre-etch stop film overlapping with the gate spacer and the dummy silicon gate; and etching the pre-etch stop film overlapping with the gate spacer and the dummy silicon gate.

2. The method of claim 1, wherein the etching the pre-etch stop film comprises:

patterning the pre-etch stop film to expose the gate spacer and the dummy silicon gate.

3. The method of claim 1, wherein the forming a trench comprises:

removing a portion of the upper part of the gate spacer using the etch stop film as an etching mask to reduce a thickness of the upper part of the gate spacer.

4. The method of claim 3, wherein an inner surface of the gate spacer has a staircase shape.

5. The method of claim 3, wherein the removing a first portion of the upper part of the gate spacer comprises:

etching an upper portion of the dummy silicon gate that is on the upper part of the gate spacer to expose an inner surface of the upper part of the gate spacer.

6. The method of claim 1, wherein the etch stop film includes a material having etching selectivity with respect to the gate spacer and the dummy silicon gate.

7. The method of claim 6, wherein the etch stop film includes a material comprising silicon (Si) and at least one of carbon (C), nitrogen (N), oxygen (Q) or hydrogen (H).

8. The method of claim 7, wherein the etch stop film is a graded layer including a material having a composition ratio varying in a thickness direction of the substrate, and wherein a portion of the etch stop film adjacent to the interlayer insulation film includes a material having etching selectivity with respect to the interlayer insulation film, and a portion of the etch stop film spaced apart from the interlayer insulation film includes an etching resistant material.

9. The method of claim 6, wherein the etch stop film includes a lower etch stop film and an upper etch stop film which are sequentially formed, wherein the lower etch stop film includes one of a metal oxide film, a metal nitride film, a germanium film or a combination thereof, and wherein the upper etch stop film includes a material comprising silicon (Si) and at least one of carbon (C), nitrogen (N), oxygen (O) or hydrogen (H).

10. The method of claim 1, further comprising:

forming a lower electrode film along the upper surface of the interlayer insulation film and a side surface and a bottom surface of the trench;

forming an upper electrode film on the lower electrode film in the trench and on the upper surface of the interlayer insulation film; and planarizing the lower electrode film and the upper electrode film to expose the etch stop film.

11. The method of claim 10, further comprising:

after exposing the etch stop film, removing a portion of the lower electrode film and the upper electrode film in the trench to form a recess;

forming a capping film in the recess and on the upper surface of the interlayer insulation film; and planarizing the capping film to form a capping pattern in the trench.

12. The method of claim 10, further comprising:

before forming the lower electrode film, forming a pre p-type work function adjusting film along the upper surface of the interlayer insulation film and the side and bottom surfaces of the trench;

forming a sacrificial film on the pre p-type work function adjusting film in a portion of the trench; and etching back the pre p-type work function adjusting film using the sacrificial film as a mask to form a p-type work function adjusting film along a portion of the side surface and the bottom surface of the trench.

13. A method of fabricating a semiconductor device, the method comprising:

forming, on a fin type active pattern, a dummy silicon gate and a gate spacer crossing the fin type active pattern;

forming an interlayer insulation film on the fin type active pattern, the interlayer insulation film including an upper surface that is lower than an upper surface of the dummy silicon gate;

forming an etch stop film on the interlayer insulation film, the etch stop film exposing the dummy silicon gate and including a material having etching selectivity with respect to the dummy silicon gate and the gate spacer, wherein forming the etch stop film comprises:

forming a pre-etch stop film on the gate spacer, the dummy silicon gate and the upper surface of the interlayer insulation film;

forming a mask film on the pre-etch stop film, the mask film having etching selectivity with respect to the pre-etch stop film;

planarizing the mask film to expose a portion of the pre-etch stop film overlapping with the gate spacer and the dummy silicon gate; and etching the exposed portion of the pre-etch stop film;

forming a trench exposing the fin type active pattern by removing the dummy silicon gate using the etch stop film as a mask, wherein the forming a trench comprises removing a portion of the gate spacer, and wherein the removing a portion of the gate spacer comprises:

etching a portion of the dummy silicon gate to protrude the portion of the gate spacer from an upper surface of the etched dummy silicon gate; and reducing a thickness of the portion of the gate spacer protruding from the upper surface of the etched dummy silicon gate; and forming a gate electrode in the trench and crossing the fin type active pattern.

14. The method of claim 13, wherein the etch stop film includes a material comprising silicon (Si) and at least one of carbon (C), nitrogen (N), oxygen (O) or hydrogen (H).

15. The method of claim 13, wherein the forming an interlayer insulation film comprises:

forming a pre interlayer insulation film to surround the dummy silicon gate and the gate spacer and expose the upper surface of the dummy silicon gate; and recessing a portion of the pre interlayer insulation film.

16. A method of forming a semiconductor device, the method comprising:

forming a dummy gate electrode on a substrate;

forming a gate spacer on a side surface of the dummy gate electrode;

forming an interlayer insulation film on the gate spacer;

recessing the interlayer insulation film relative to the gate spacer to expose respective top surfaces of the gate spacer and the dummy gate electrode;

forming an etch stop film on the interlayer insulation film, the etch stop film including an opening exposing the top surfaces of the gate spacer and the dummy gate electrode, wherein forming the etch stop film comprises:
  forming a pre-etch stop film on the gate spacer, the dummy gate electrode and an upper surface of the interlayer insulation film;
  forming a mask film on the pre-etch stop film, the mask film having etching selectivity with respect to the pre-etch stop film;
  planarizing the mask film to expose a portion of the pre-etch stop film overlapping with the gate spacer and the dummy gate electrode; and
  etching the exposed portion of the pre-etch stop film;
recessing the dummy gate electrode relative to the gate spacer to expose an inner surface of a top portion of the gate spacer;
reducing a thickness of the top portion of the gate spacer comprising the inner surface that is exposed;
removing the dummy gate electrode; and
forming a gate electrode on the gate spacer after removing the dummy gate electrode.

17. The method of claim 16, wherein the reducing a thickness of the top portion of the gate spacer comprises only partially reducing a lateral thickness of the top portion of the gate spacer.

* * * * *